(12) United States Patent
Hayashi

(10) Patent No.: US 6,849,490 B2
(45) Date of Patent: Feb. 1, 2005

(54) SEMICONDUCTOR DEVICE HAVING A MEMORY CELL REGION AND A PERIPHERAL CIRCUIT REGION AND METHOD OF MANUFACTURING THEREOF

(75) Inventor: Fumihiko Hayashi, Tokyo (JP)

(73) Assignee: NEC Electronics Corporation, Tokyo (JP)

(*) Notice: Subject to any disclaimer, the term of this patent is extended or adjusted under 35 U.S.C. 154(b) by 0 days.

(21) Appl. No.: 09/864,259

(22) Filed: May 25, 2001

(65) Prior Publication Data

US 2001/0048130 A1 Dec. 6, 2001

(30) Foreign Application Priority Data

May 25, 2000 (JP) ........................................ 2000-154561

(51) Int. Cl.[7] ..................... H01L 31/072; H01L 31/109; H01L 31/0328; H01L 31/0336
(52) U.S. Cl. ........................................ 438/201; 438/257
(58) Field of Search .................................. 257/314, 315, 257/316; 438/201, 211, 257, 258, 263, 583, 649

(56) References Cited

U.S. PATENT DOCUMENTS

| 6,037,625 | A | * | 3/2000 | Matsubara et al. | ......... 257/315 |
| 6,043,537 | A | * | 3/2000 | Jun et al. | ..................... 257/350 |
| 6,339,237 | B1 | * | 1/2002 | Nomachi et al. | ........... 257/282 |
| 6,518,618 | B1 | * | 2/2003 | Fazio et al. | ................ 257/315 |

FOREIGN PATENT DOCUMENTS

JP 08-330453 12/1996

\* cited by examiner

*Primary Examiner*—Hoai Pham
(74) *Attorney, Agent, or Firm*—Sughrue Mion, PLLC

(57) ABSTRACT

To provide a semiconductor storage apparatus and a manufacturing method thereof in which a memory cell source area is not silicided and a resistance dispersion caused by insufficient silicidation is therefore eliminated, and in which a silicide film is prevented from being formed in the step portion of a self-aligned source structure and therefore a resistance dispersion by a disconnected silicide film is not generated. In a semiconductor storage apparatus having a memory cell portion in which a source area is formed by a self-aligned process, a silicide blocking portion is disposed in a part of the surface of a source diffusion layer such that the resistance dispersion caused by the insufficient silicidation of the source diffusion layer is not generated.

13 Claims, 20 Drawing Sheets

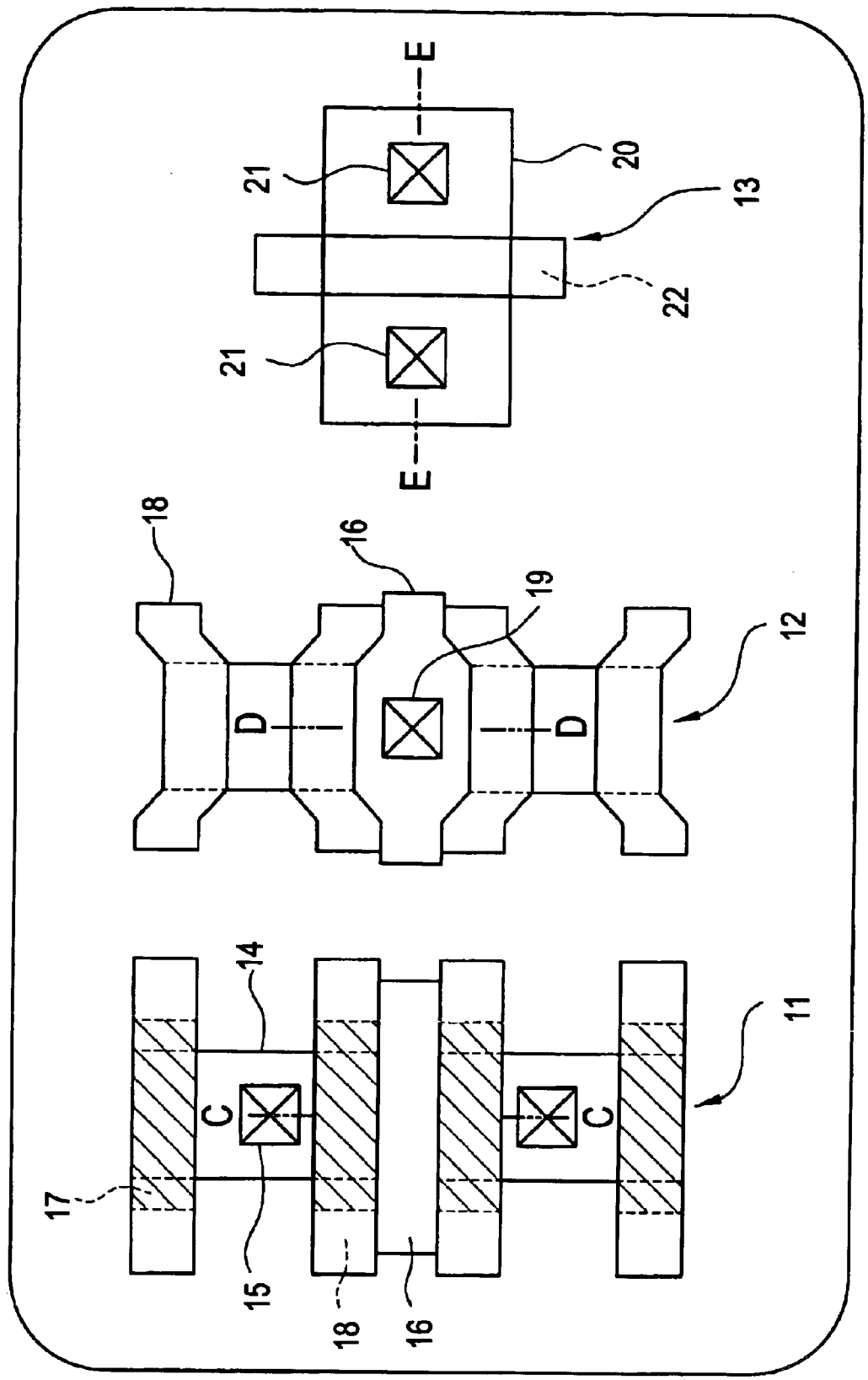

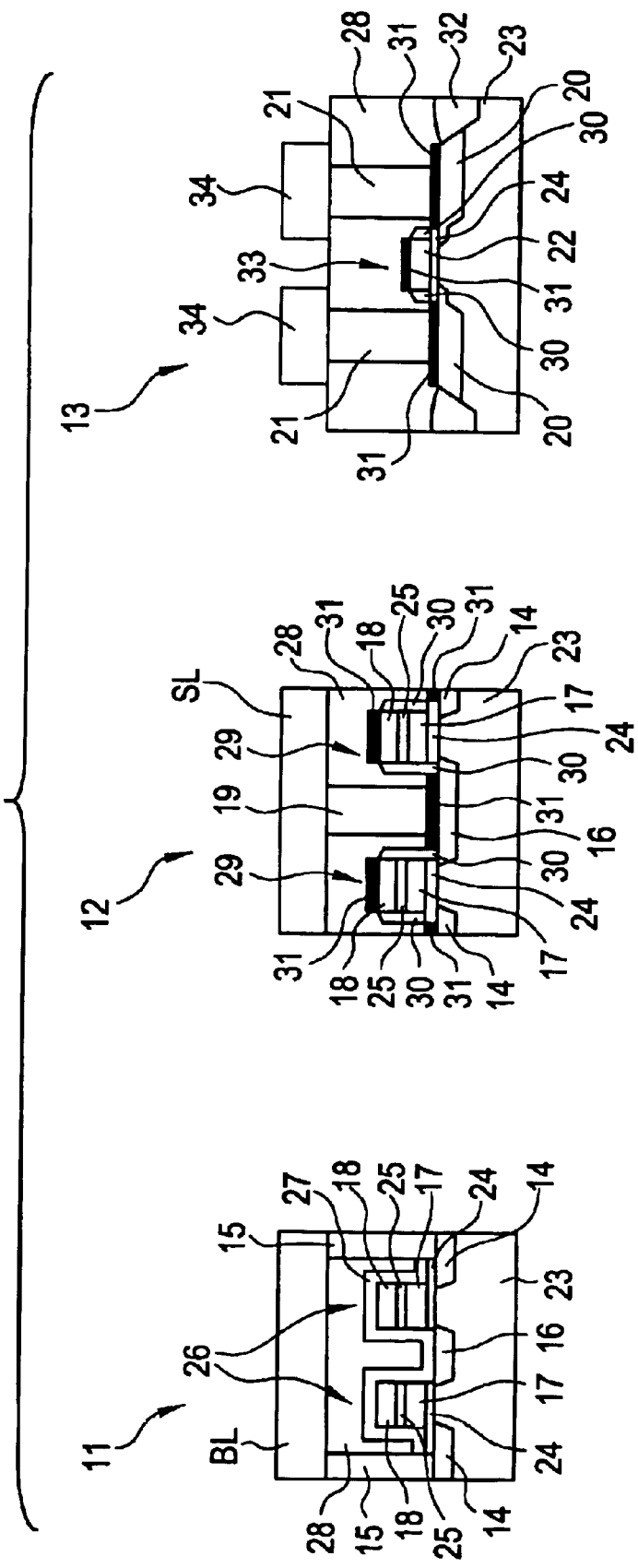

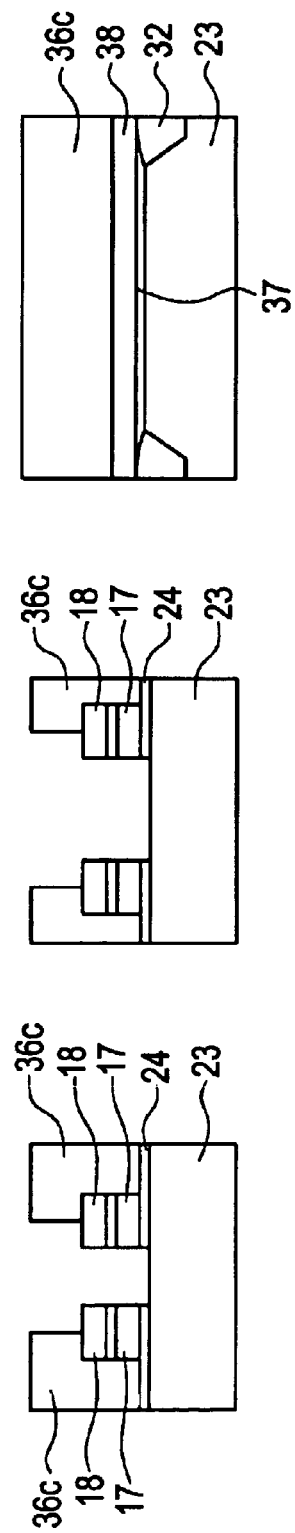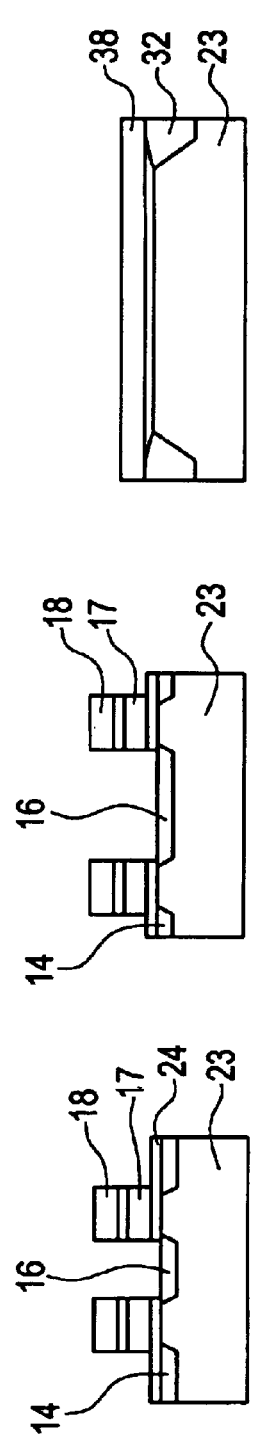

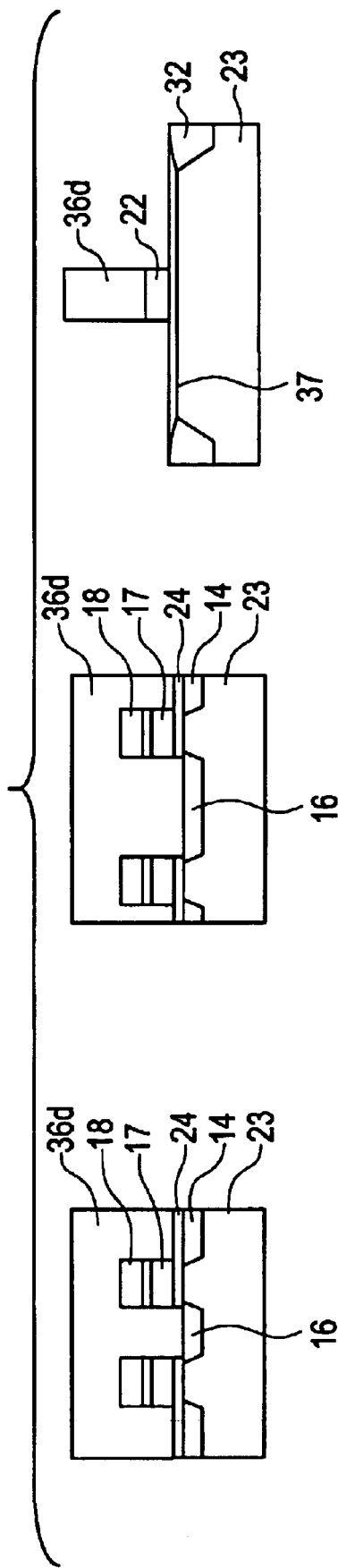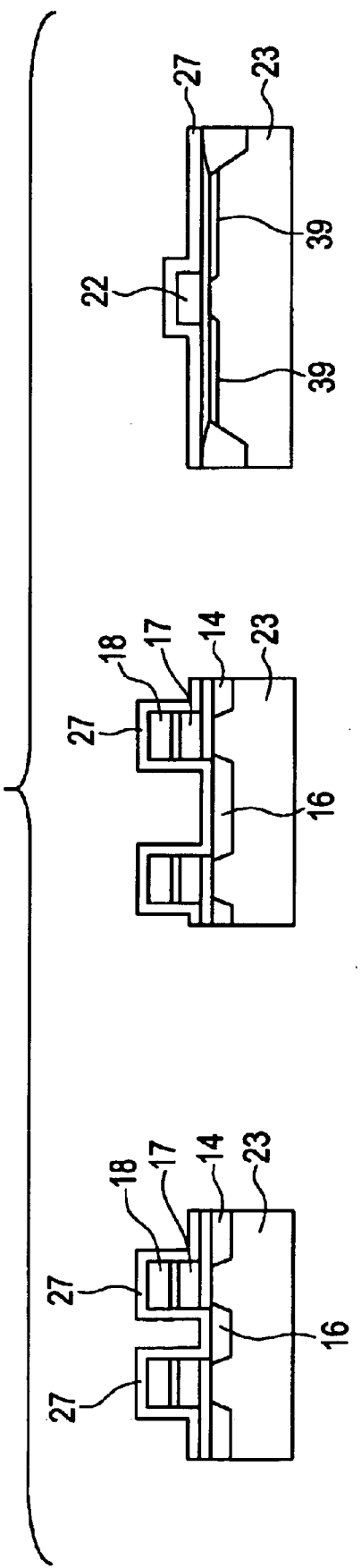

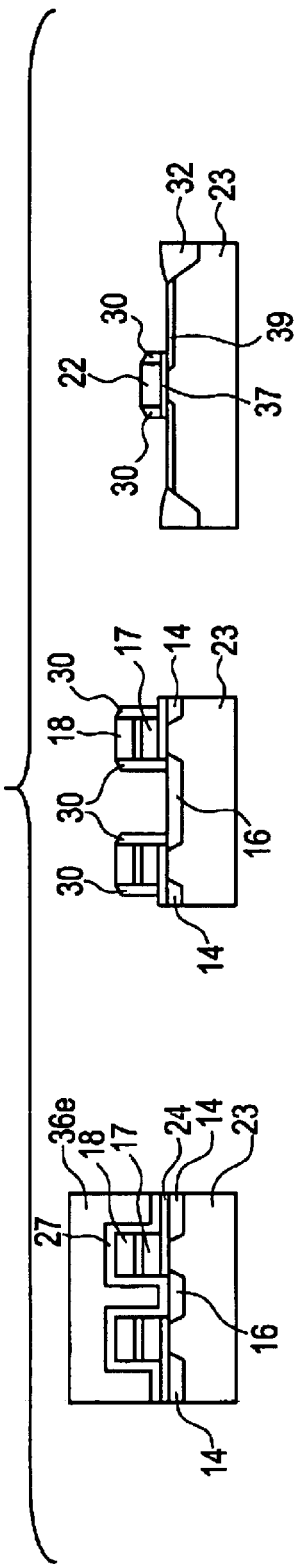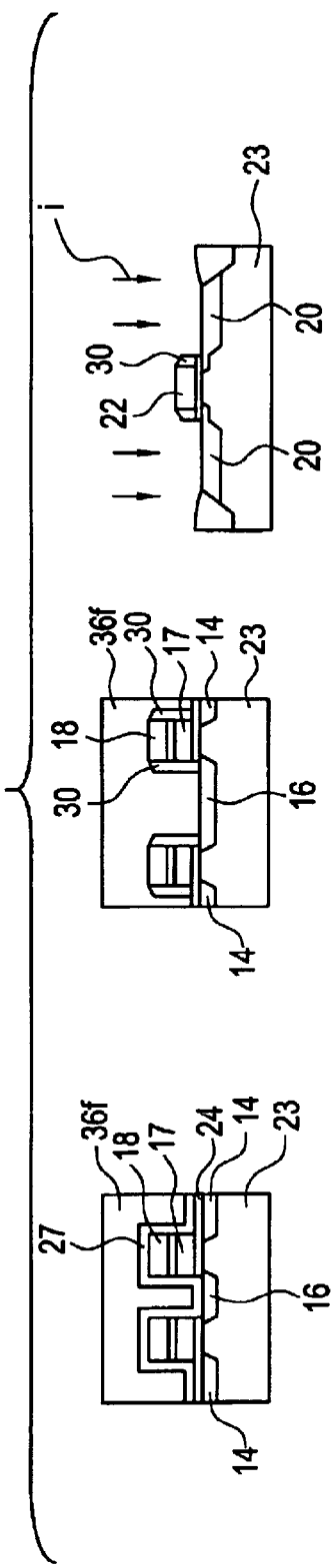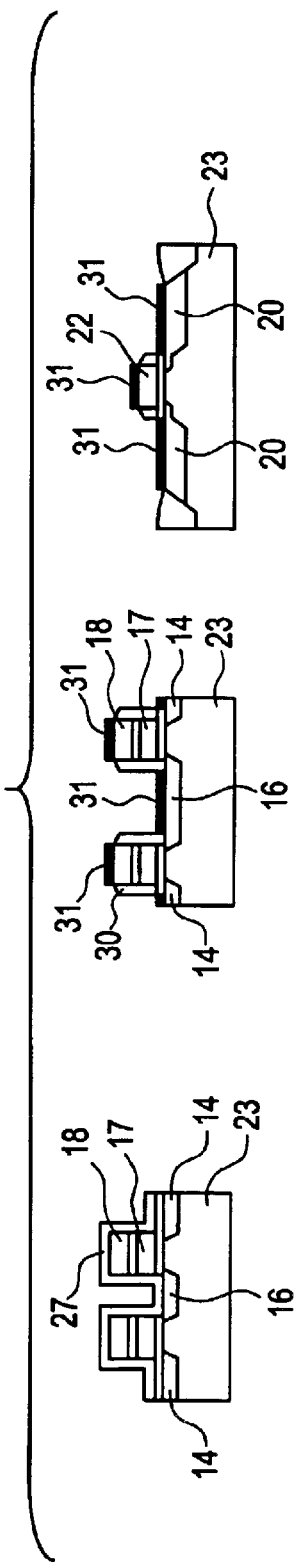

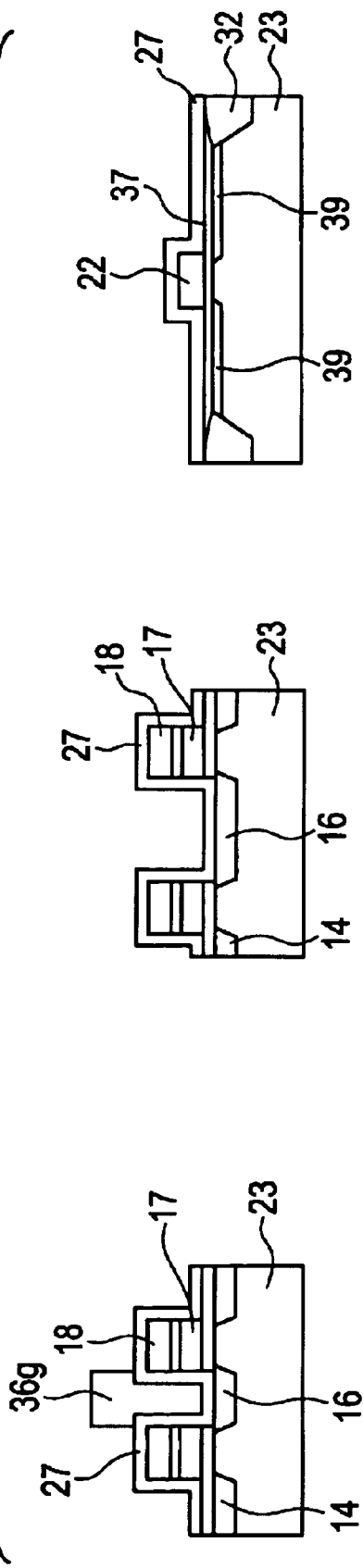
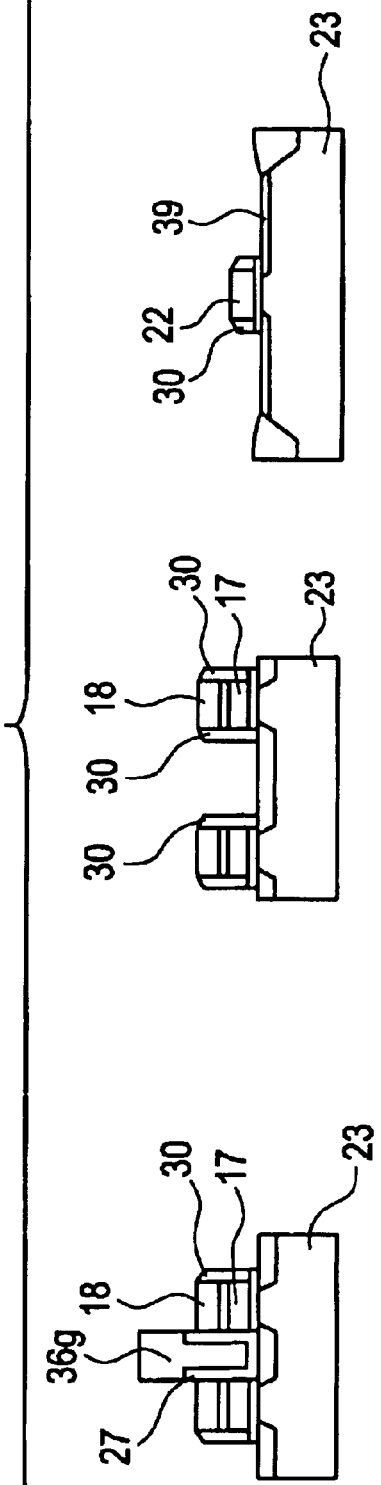

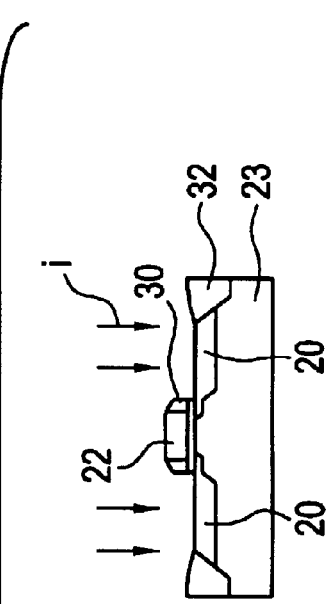
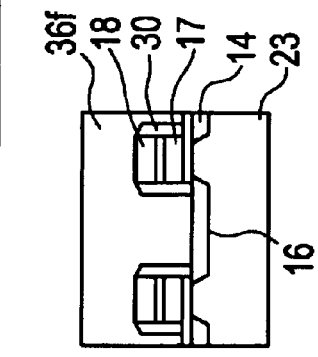
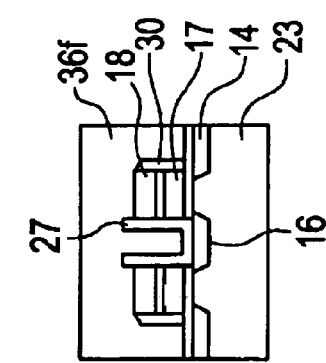
FIG. 8C
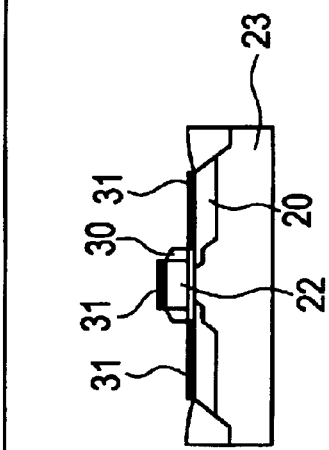
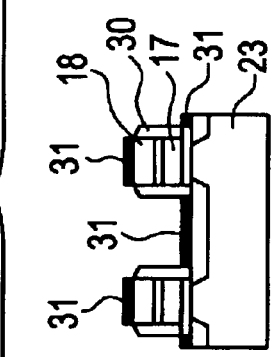
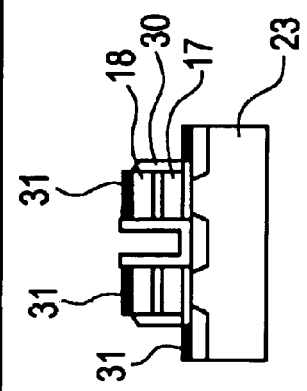
FIG. 8D

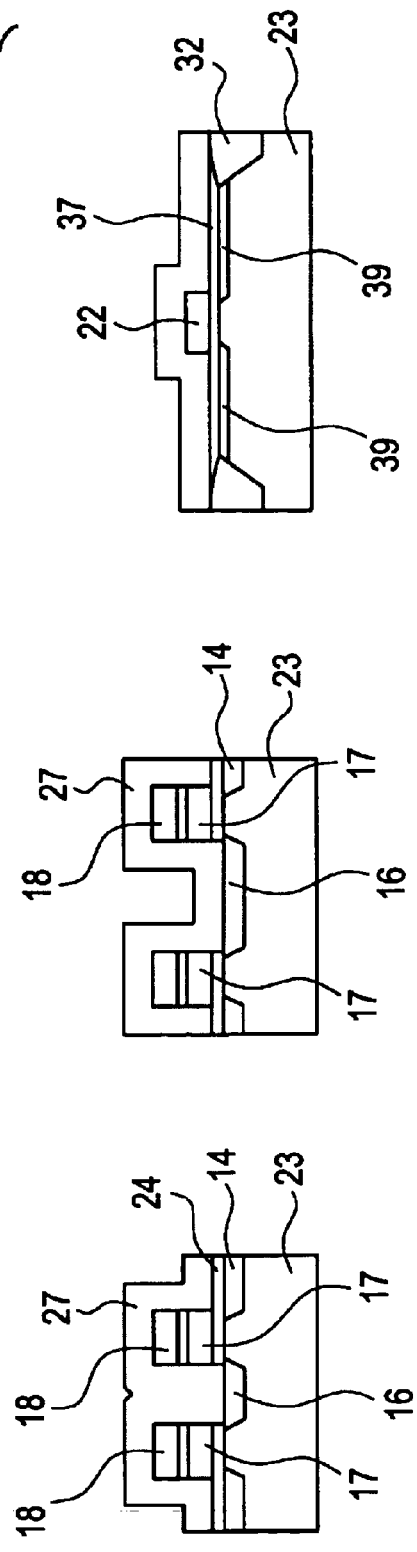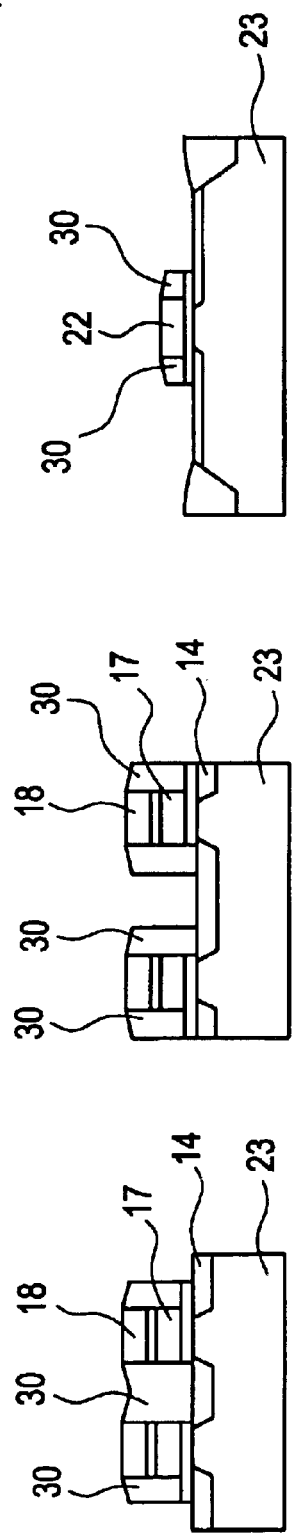

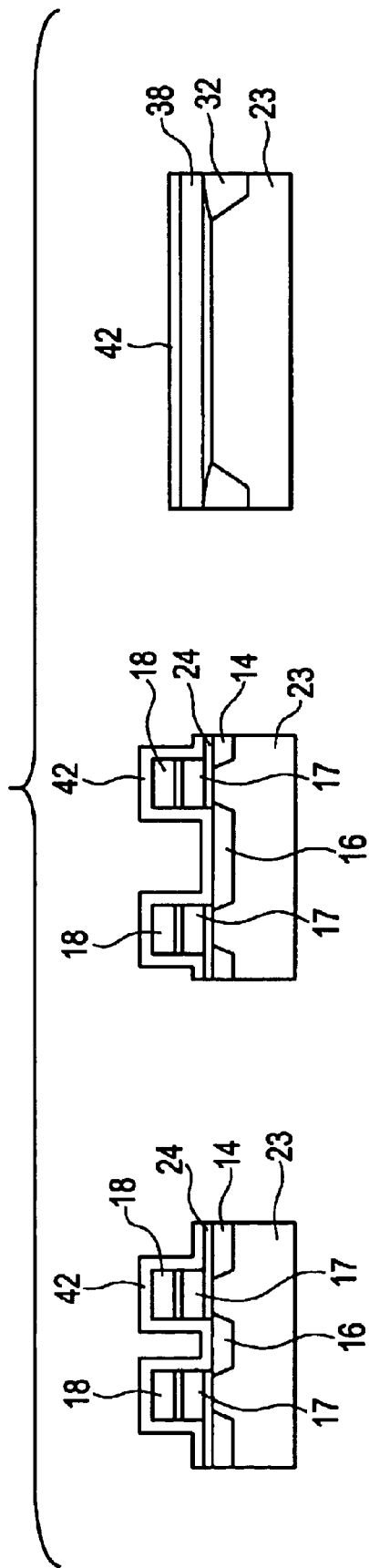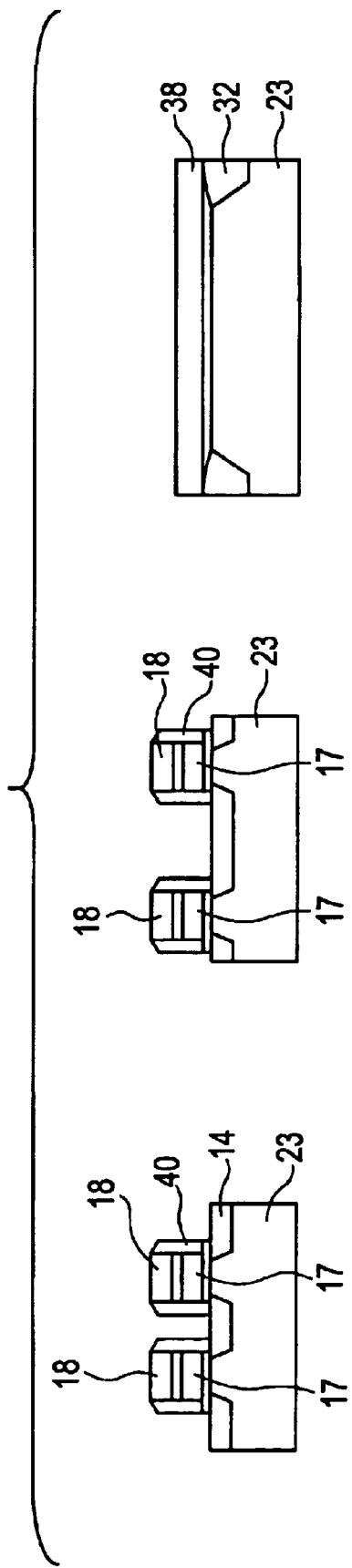

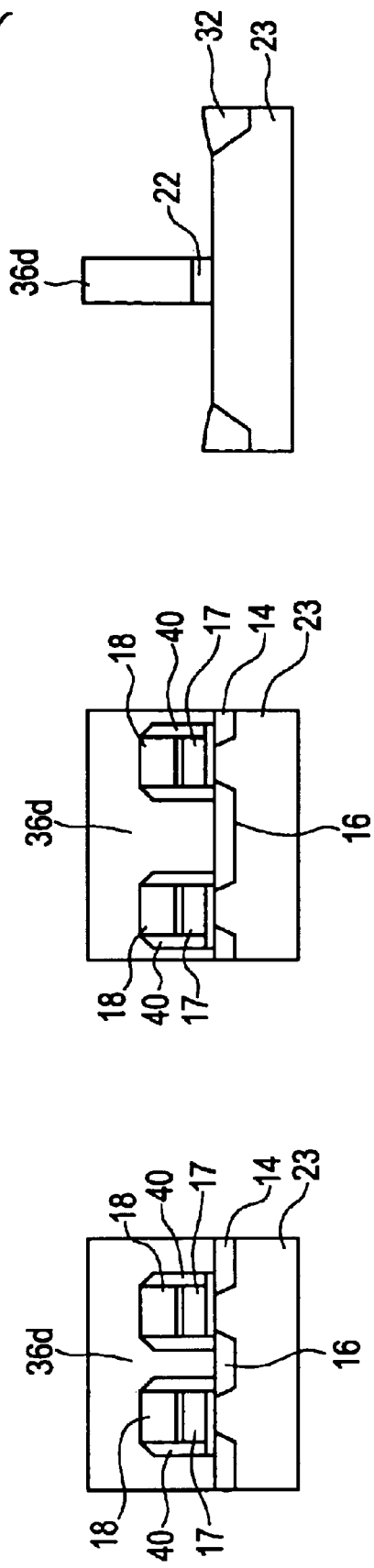
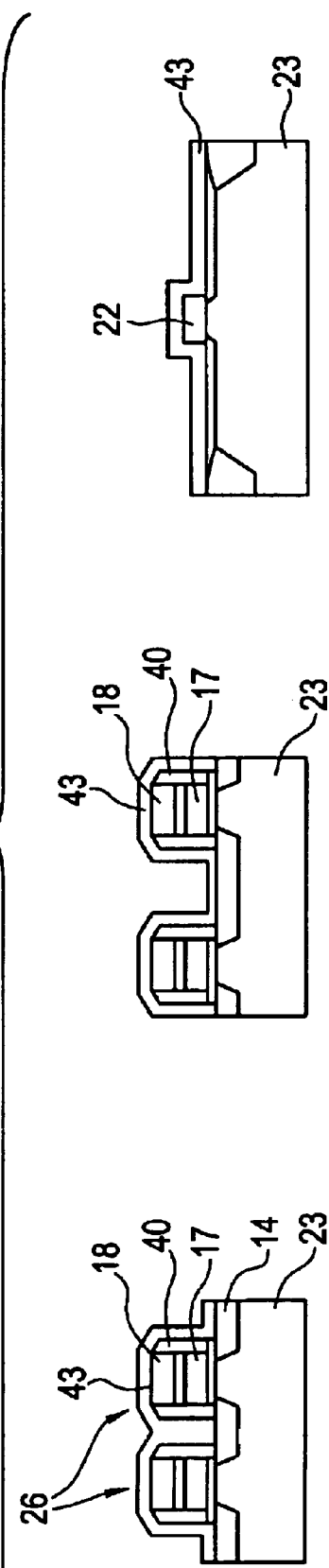
FIG. 12C
FIG. 12D

SEMICONDUCTOR DEVICE HAVING A MEMORY CELL REGION AND A PERIPHERAL CIRCUIT REGION AND METHOD OF MANUFACTURING THEREOF

BACKGROUND OF THE INVENTION

1. Field of the Invention

The present invention relates to a semiconductor storage apparatus and a manufacturing method thereof, particularly but not limited to a flash memory having a self-aligned silicide (SALICIDE) structure and a manufacturing method of the flash memory. The present application is based on Japanese Patent Application No. 154561/2000, which is incorporated herein by reference

2. Background

FIG. 1 is an equivalent circuit diagram of a flash memory cell array. As shown in FIG. 1, a flash memory 1 includes a plurality of memory cells 1a, X decoder 1b, and Y decoder and sense amplifier 1c.

A gate electrode of a transistor constituting each memory cell 1a is connected to a word line WL (only WL1 to WL4 are shown), a drain side of the transistor is connected to a bit line BL (only BL1 to BL3 are shown) via a drain contact 2, and a source side of the transistor is connected to a source line SL via a source contact 3.

Moreover, each word line WL is connected to the X decoder 1b, each bit line BL is connected to the Y decoder and sense amplifier 1c, each memory cell 1a is selectively designated by the word line WL, and information is inputted/outputted via the bit line BL.

FIG. 2 is an explanatory plan view showing a part of the memory cells of FIG. 1. As shown in FIG. 2, the transistors constituting the memory cell 1a are disposed on opposite sides via the drain contact 2. The drain contact 2 is disposed in a drain diffusion layer 4a, and a source diffusion layer 4b is disposed between the word lines WL adjacent to each other.

FIGS. 3A to 3B are sectional views showing a portion of a manufacturing process of the flash memory. The left figures of FIGS. 3A to 3E are views taken along lines A—A of FIG. 2. The right figures of FIGS. 3A to 3E are views taken along lines B—B of FIG. 2. As shown in FIG. 3A, when the flash memory 1 is manufactured, first an isolation oxide film 5a and a tunnel oxide film 5b are formed on a P-type silicon substrate 5, further a floating gate 5c, inter-poly insulating film 5d, and control gate 5e are successively stacked, and a transistor 6 is formed on the silicon substrate 5.

Subsequently, as shown in FIG. 3B, a photo-resist 7 is patterned so as to open only a source portion, then the isolation oxide film 5a is etched by using the photo-resist 7 as a mask. Subsequently, as shown in FIG. 3C, the source diffusion layer 4b common to two adjacent transistors 6, and then the drain diffusion layer 4a are formed by ion implantation.

A structure formed by the aforementioned process is called a self-aligned source structure. In the structure it is unnecessary to dispose the source contact for each memory cell, an alignment margin, and the like are unnecessary, and a memory cell size can be reduced.

Subsequently, as shown in FIG. 3D, side walls 8 are formed on both side surfaces of each transistor 6, and subsequently, as shown in FIG. 3E, the respective exposed surfaces of the drain diffusion layer 4a, source diffusion layer 4b and control gate 5c are covered with a silicide film 9.

The silicide film 9 can be formed by alloy forming reaction of a refractory metal film with a substrate, and, for example, a known self-aligned silicide (SALICIDE) process using titanium (Ti) can be used to form the silicide film.

The SALICIDE process, for example, includes: forming the gate electrode and side wall; subsequently implanting impurities to form the source/drain diffusion layers and annealing the layers; subsequently sputtering titanium, for example, by 50 nm; annealing the layers at about 700° C. to perform silicidation; and removing non-reacted titanium. Thereby, the silicide film 9 on the drain diffusion layer 4a, source diffusion layer 4b and control gate 5c can easily be formed in a self-aligned manner (see Japanese Patent Application Laid-Open No. 330453/1996).

To form the silicide film on the diffusion layer and gate surface in this manner is essential, especially in a random logic large scale integrated (LSI) circuit, in order to reduce parasitic resistance and realize a fine and high performance device.

However, since the source area of the memory cell 1a is held between the gates and is very narrow, a sputtering film cannot easily enter the area, and silicidation tends to be insufficient. This brings about a dispersion of resistance. Moreover, when the isolation oxide film 5a and tunnel oxide film 5b are etched, a step portion is generated, as shown in FIG. 3B. Therefore, since a step portion L is covered with the silicide film 9, as shown in FIG. 3E, the silicide film 9 is easily disconnected in the step portion L, and the dispersion of resistance is caused by disconnection.

An object of the present invention is to provide a semiconductor storage apparatus and a manufacturing method thereof in which a memory cell source area is not silicided, dispersion of resistance caused by insufficient silicidation is therefore eliminated, and dispersion of resistance caused by disconnection of a silicide film in the step portion of a self-aligned source structure is also prevented.

SUMMARY OF THE INVENTION

To achieve the aforementioned object, according to an embodiment of the present invention, there is provided a semiconductor storage apparatus having a memory cell portion in which a source area is formed by a self-aligned process, the semiconductor storage apparatus comprising a silicide blocking portion for preventing a dispersion of resistance from being caused by insufficient silicidation of the source area in a part of the surface of the source area.

According to the aforementioned constitution of the embodiment of the present invention, the semiconductor storage apparatus having the memory cell portion in which the source area is formed by the self-aligned process comprises the silicide blocking portion for preventing the resistance dispersion from being caused by insufficient silicidation of the source area in a part of the surface of the source area. Thereby, since the source area of a memory cell is not silicided, the resistance dispersion caused by insufficient silicidation is eliminated, and resistance dispersion by disconnection of a silicide film in the step portion of a self-aligned source structure is also prevented from occurring.

Moreover, according to a manufacturing method of the semiconductor storage apparatus of one embodiment of the present invention, the semiconductor storage apparatus can be manufactured.

BRIEF DESCRIPTION OF THE DRAWINGS

The above and other objects, advantages and features of the present invention will be more apparent from the following description taken in conjunction with the accompanying drawings, in which:

FIG. 4 is an explanatory plan view showing a part of a semiconductor storage apparatus according to a first embodiment of the present invention.

FIG. 5 is a sectional view taken along lines C—C, D—D and E—E of FIG. 4, showing structures of a memory cell portion, source contact portion and peripheral transistor portion.

FIG. 6E is a sectional view taken along the lines C—C, D—D and E—E of FIG. 4, showing a manufacturing process of the semiconductor storage apparatus.

FIG. 6F is a sectional view taken along the lines C—C, D—D and E—E of FIG. 4, showing a manufacturing process of the semiconductor storage apparatus.

FIG. 6G is a sectional view taken along the lines C—C, D—D and E—E of FIG. 4, showing a manufacturing process of the semiconductor storage apparatus.

FIG. 6H is a sectional view taken along the lines C—C, D—D and E—E of FIG. 4, showing a manufacturing process of the semiconductor storage apparatus.

FIG. 6I is a sectional view taken along the lines C—C, D—D and E—E of FIG. 4, showing a manufacturing process of the semiconductor storage apparatus.

FIG. 6J is a sectional view taken along the lines C—C, D—D and E—E of FIG. 4, showing a manufacturing process of the semiconductor storage apparatus.

FIG. 6K is a sectional view taken along the lines C—C, D—D and E—E of FIG. 4, showing a manufacturing process of the semiconductor storage apparatus.

FIG. 8A shows sectional views taken along the lines C—C, D—D and E—E of FIG. 4, similar to those of FIGS. 6A to 6K, showing the manufacturing process of the semiconductor storage apparatus of FIG. 7.

FIG. 8B shows sectional views taken along the lines C—C, D—D and E—E of FIG. 4, similar to those of FIGS. 6A to 6K, showing the manufacturing process of the semiconductor storage apparatus of FIG. 7.

FIG. 8C shows sectional views taken along the lines C—C, D—D and E—E of FIG. 4, similar to those of FIGS. 6A to 6K, showing the manufacturing process of the semiconductor storage apparatus of FIG. 7.

FIG. 8D shows sectional views taken along the lines C—C, D—D and E—E of FIG. 4, similar to those of FIGS. 6A to 6K, showing the manufacturing process of the semiconductor storage apparatus of FIG. 7.

FIG. 10A shows sectional views taken along the lines C—C, D—D and E—E of FIG. 4, similar to those of FIGS. 6A to 6K, showing the manufacturing process of the semiconductor storage apparatus of FIG. 9.

FIG. 10B shows sectional views taken along the lines C—C, D—D and E—E of FIG. 4, similar to those of FIGS. 6A to 6K, showing the manufacturing process of the semiconductor storage apparatus of FIG. 9.

FIG. 12A shows sectional views taken along the lines C—C, D—D and E—E of FIG. 4, similar to those of FIGS. 6A to 6K, showing the manufacturing process of the semiconductor storage apparatus of FIG. 11.

FIG. 12B shows sectional views taken along the lines C—C, D—D and E—E of FIG. 4, similar to those of FIGS. 6A to 6K, showing the manufacturing process of the semiconductor storage apparatus of FIG. 11.

FIG. 12C shows sectional views taken along the lines C—C, D—D and E—E of FIG. 4, similar to those of FIGS. 6A to 6K, showing the manufacturing process of the semiconductor storage apparatus of FIG. 11.

FIG. 12D shows sectional views taken along the lines C—C, D—D and E—E of FIG. 4, similar to those of FIGS. 6A to 6K, showing the manufacturing process of the semiconductor storage apparatus of FIG. 11.

BRIEF DESCRIPTION OF THE PREFERRED EMBODIMENTS

Figure 1:
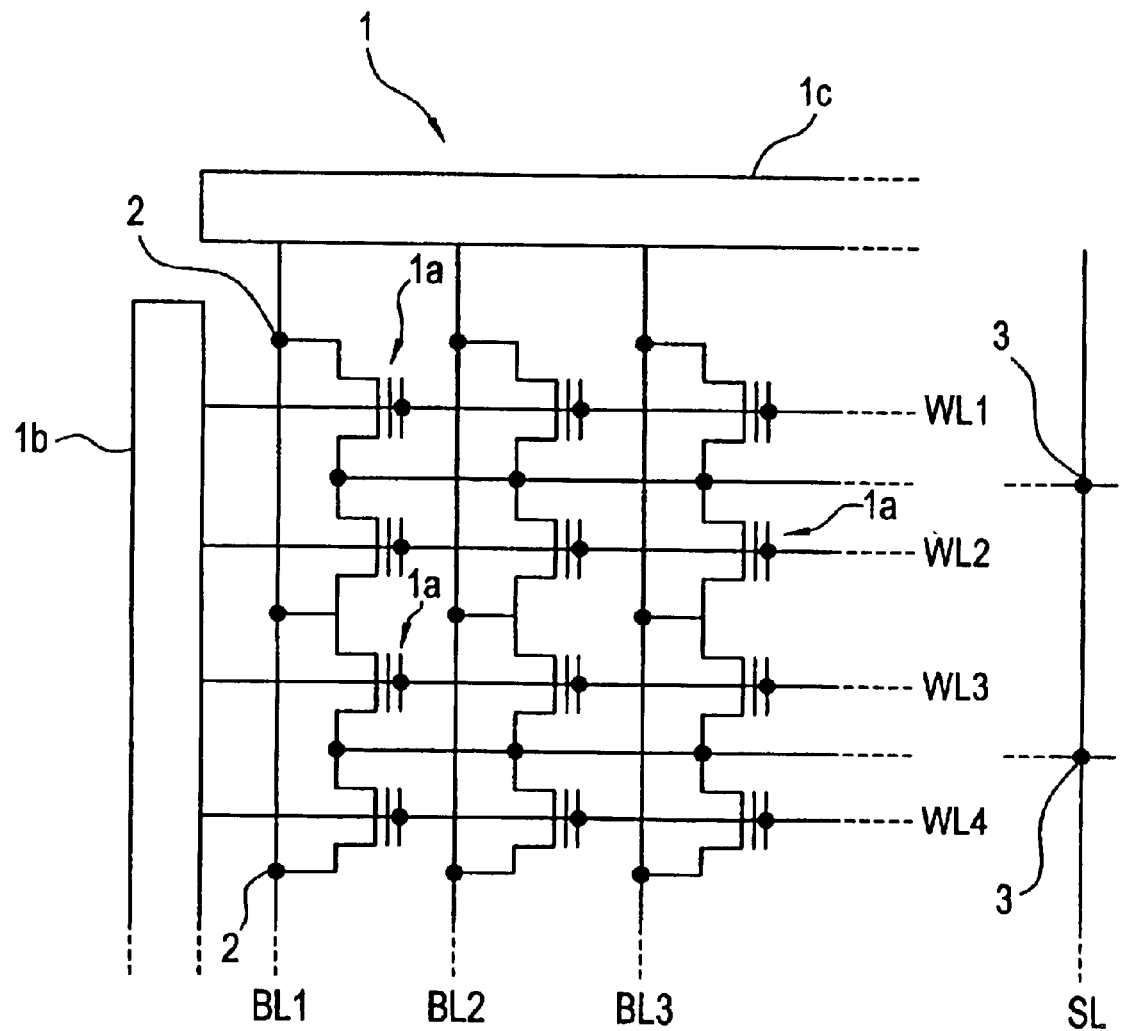
FIG. 1 is an equivalent circuit diagram of a flash memory cell array.

Embodiments of the present invention will be described hereinafter with reference to the accompanying drawings. It is understood that the invention is not limited to this embodiment, which is provided as only one example of an implementation of the invention. For example, the invention is not restricted to flash memories, is applicable to other memories such as memories in general.

(First Embodiment)

FIG. 4 is an explanatory plan view showing a part of a semiconductor storage apparatus according to a first embodiment of the present invention. As shown in FIG. 4, a semiconductor storage apparatus 10, which can be a part of a flash memory (nonvolatile storage apparatus) embedded random logic LSI, includes a memory cell portion 11, source contact portion 12 and peripheral transistor portion 13. The memory cell portion 11 comprises a plurality of memory cells that are arranged in a matrix. The source contact portion 12 is arranged in the edge of the memory cell portion 11. The peripheral transistor portion 13 comprises an X decoder 1b (in FIG. 1), a Y decoder and sense amplifier 1c (in FIG. 1) and a logic circuit portion (that is not shown in FIG. 1).

Each of the flash memories can be an NOR type flash memory, and an equivalent circuit diagram thereof is similar to that of the aforementioned flash memory cell array, as shown in FIG. 1.

As shown in FIG. 1, a gate electrode (18 of FIG. 4) of a transistor constituting each memory cell is connected to a word line WL, a drain side of the transistor is connected to a bit line BL Via a drain contact (15 of FIG. 4), and a source side of the transistor is connected to a source line SL via a source contact (19 of FIG. 4). The source diffusion layer 16 in the source contact portion 12 is connected to the source diffusion layer 16 in the memory cell portion 11, and connected to the source line SL via the source contact 19. Moreover, each word line WL is connected to the X decoder 1b, each bit line BL is connected to the Y decoder and sense amplifier 1c, each memory cell is selectively designated by the word line WL, and information is inputted/outputted via the bit line BL.

The transistor constituting the memory cell portion 11 includes a drain contact 15 disposed in a drain diffusion layer 14, and includes a floating gate 17 and control gate 18 connected to the word lines WL which are adjacent to each other via a source diffusion layer 16. As indicated in FIG. 4 by the cross-hatch pattern and as shown in FIG. 5, the floating gate 17 is below the control gate 18.

The source contact portion 12 is positioned on both sides of a source contact 19 disposed on the source diffusion layer 16. The source diffusion layer 16 in the source contact portion 12 is connected to the source diffusion layer 16 in the memory cell portion 11, and connected to the source line SL via the source contact 19. Moreover, the transistor constituting the peripheral transistor portion 13 is positioned between peripheral contacts 21 disposed on a peripheral diffusion layer 20, and includes a peripheral gate 22 connected to a peripheral circuit wiring.

The left figures of FIG. 5 show sectional views taken along lines C—C of FIG. 4, showing the structures of the memory cell portion 11, and the center figures of FIG. 5 show sectional views taken along lines D—D of FIG. 4, showing source contact portion 12, and the right figures of FIG. 5 show sectional views taken along lines E—E of FIG. 4, showing peripheral transistor portion 13.

As shown in FIG. 5, in the memory cell 11, the drain diffusion layer 14 and source diffusion layer 16 are formed on a silicon substrate 23, and a transistor 26 is formed by successively stacking a tunnel oxide film 24, floating gate 17, interpoly insulating film 25, and control gate 18 on the silicon substrate 23.

The transistor 26 is covered with an interlayer film 28 formed of a boro-phospho silicate glass (BPSG) film via an oxide film 27 with which the entire surface is covered, and the drain contact 15 connected to the drain diffusion layer 14 and bit line BL is formed on the interlayer film 28.

Moreover, in the source contact portion 12, the drain diffusion layer 14 and source diffusion layer 16 are formed on the silicon substrate 23, and the tunnel oxide film 24, floating gate 17, interpoly insulating film 25, and control gate 18 are successively stacked on the silicon substrate 23.

In a stacked portion 29 formed of the tunnel oxide film 24, floating gate 17, interpoly insulating film 25 and control gate 18, side walls 30 are formed on the respective side surfaces of the floating gate 17 and control gate 18, and silicide films 31 are formed on the respective upper surfaces of the drain diffusion layer 14, source diffusion layer 16 and control gate 18. The stacked portion is covered with the interlayer film 28.

In the interlayer film 28, the source contact 19 is formed to connect the source diffusion layer 16 with the source line SL via the suicide film 31.

Moreover, in the peripheral transistor portion 13, an isolation oxide film 32 and peripheral diffusion layer 20 are formed on the silicon substrate 23, for example, by local oxidation of silicon (LOCOS), and a transistor 33 is formed by successively stacking the tunnel oxide film 24 and peripheral gate 22 on the silicon substrate 23.

In the transistor 33, the side walls 30 are formed on the side surfaces of the peripheral gate 22, and the silicide films 31 are formed on the respective upper surfaces of the peripheral diffusion layer 20 and peripheral gate 22. The transistor is covered with the interlayer film 28. In the interlayer film 28, the peripheral contact 21 is formed to connect the peripheral diffusion layer 20 with a peripheral wiring 34 via silicide film 31.

FIGS. 6A to 6K are sectional views showing a manufacturing process of the semiconductor storage apparatus of FIG. 4. Other manufacturing methods may be used and the invention is not limited to the manufacturing method described herein. The left figures of FIGS. 6A to 6K are taken along the lines C—C of FIG. 4. The center figures of FIGS. 6A to 6K are taken along the lines D—D of FIG. 4. The right figures of FIGS. 6A to 6K are taken along the lines E—E of FIG. 4.

Figure 6A:
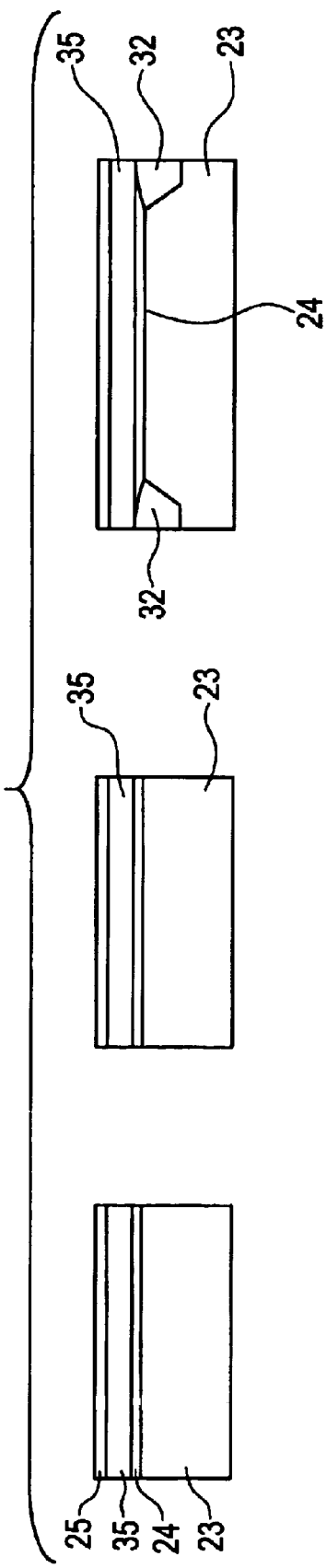
FIG. 6A is a sectional view taken along the lines C—C, D—D and E—E of FIG. 4. showing a manufacturing process of the semiconductor storage apparatus.

As shown in FIG. 6A, first the about 200 to 600 nm thick isolation oxide film 32 is formed on the P-type silicon substrate 23 by a known LOCOS method, or a shallow trench isolation (STI) method by forming a trench in the substrate and filling the oxide film into the trench.

Here, before and after forming the isolation oxide film 32, P-type impurities are ion-implanted into a P-well forming area of the silicon substrate 23, N-type impurities are ion-implanted into an N-well forming area of the silicon substrate to form a P-well and N-well each having a surface concentration of about $1\times10^{16}$ to $1\times10^{18}/cm^3$. The substrate may be subjected to a thermal treatment at about 1000 to 1200° C. to form deep P-well and N-well each having a surface concentration of about $1\times10^{16}$ to $1\times10^{18}/cm^3$.

Moreover, after forming the isolation oxide film 32, the tunnel oxide film 24, first layer of polysilicon 35, and interpoly insulating film 25 formed of an oxide nitride oxide (ONO) film are stacked in this order as shown in FIG. 6A.

The tunnel oxide film 24 is formed in a thickness of about 8 to 15 nm by a thermal oxidation method. The first layer of polysilicon 35 is deposited in a thickness of about 100 to 300 nm by a low pressure chemical vapor deposition (LPCVD) method.

The N-type impurities such as phosphorus (P) or arsenic (As) are introduced into the first layer of polysilicon 35 so that a concentration is in a range of about $1\times10^{19}$ to $1\times10^{21}/cm^3$. The impurities may be introduced by an ion implantation method after deposition, or by an in-situ doping method in which gases such as phosphine ($PH_3$) are mixed during deposition. This is patterned in a stripe shape which extends in a vertical direction of the word line WL.

The interpoly insulating film (ONO film) 25 is formed, for example, by successively depositing an oxide film, nitride film and oxide film each in a thickness of about 4 to 10 nm by the LPCVD method.

Figure 6B:
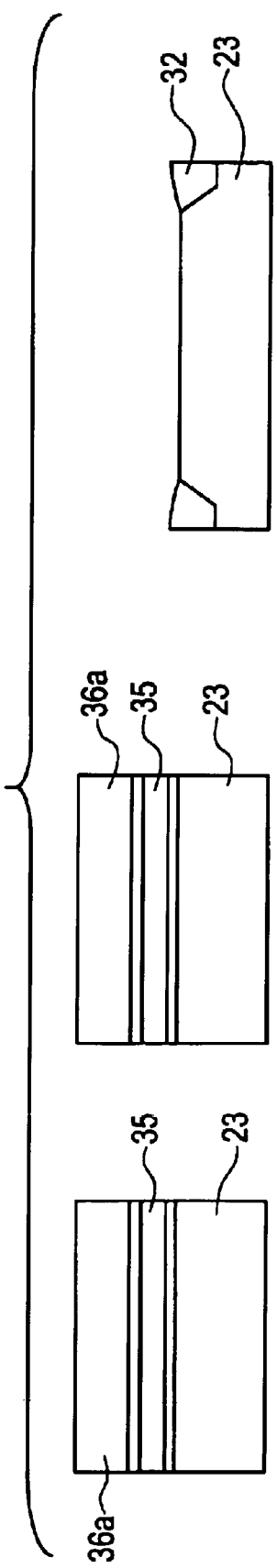
FIG. 6B is a sectional view taken along the lines C—C, D—D and E—E of FIG. 4, showing a manufacturing process of the semiconductor storage apparatus.

Subsequently, as shown in FIG. 6B, the memory cell portion 11 and source contact portion 12 are covered with a photo-resist 36a, the peripheral transistor portion 13 is opened, and the interpoly insulating film 25, first layer of polysilicon 35 and tunnel oxide film 24 are successively etched to expose the silicon substrate 23 of the peripheral transistor portion 13.

Figure 6C:
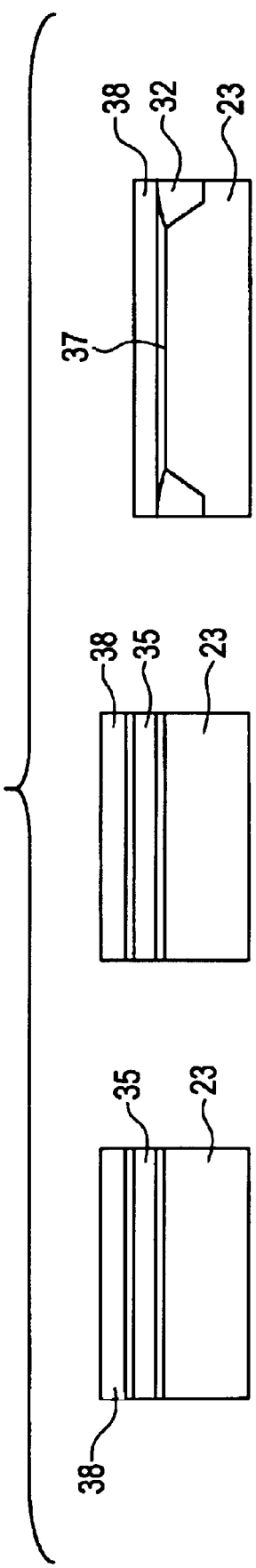
FIG. 6C is a sectional view taken along the lines C—C, D—D and E—E Of FIG. 4, showing a manufacturing process of the semiconductor storage apparatus.

Subsequently, as shown in FIG. 6C, an about 1 to 40 nm thick peripheral gate oxide film 37 is formed by the thermal oxidation method. In this case, an operation of covering an area in which a thick oxide film is formed after oxidation with the photo-resist, removing an oxide film from an area in which a thin oxide film is formed, removing the photo-resist, and oxidizing the area again is repeated. Then, the oxide films whose thickness differs with a voltage for use are formed. Such multi-oxide process may be used.

Moreover. as shown in FIG. 6C, a second layer of polysilicon 38 is deposited in a thickness of about 100 to 300 nm by the LPCVD method. The N-type impurities such as phosphorus (P) or arsenic (As) are introduced into the layer in a concentration of about $1\times10^{20}$ to $1\times10^{21}/cm^3$. The impurities may be introduced by the ion implantation method after deposition, or by the in-situ doping method in which gases such as phosphine ($PH_3$) are mixed during deposition.

Figure 6D:
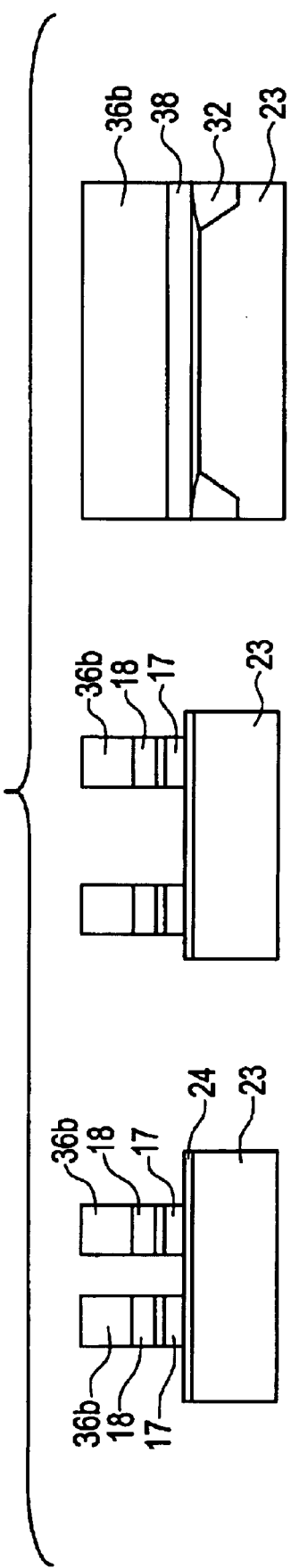
FIG. 6D is a sectional view taken along the lines C—C, D—D and E—E of FIG. 4, showing a manufacturing process of the semiconductor storage apparatus.

Subsequently, as shown in FIG. 6D, the peripheral transistor portion 13 is covered with a photo-resist 36b which is also formed on the memory cell portion 11 and source contact portion 12, the second layer of polysilicon 38, interpoly insulating film 25, and first layer of polysilicon 35 are successively etched in a stripe shape which extends in a direction of the word line WL, and the control gate 18 and floating gate 17 are formed.

Since the first layer of polysilicon 35 is patterned beforehand in the stripe shape extending in the vertical direction of the word line WL, the floating gate 17 is separated in both a word direction and a bit direction to form islands for the respective memory cells.

Subsequently, as shown in FIG. 6E, a photo-resist 36c is formed in such a manner that only the source area is opened, and the isolation oxide film 32 and the tunnel oxide film 24 are removed from this opening by dry etching to expose the silicon substrate 23.

Next, as shown in FIG. 6F, phosphorus (P) or arsenic (As) is introduced into the layer by the ion implantation, and the respective source diffusion layers 16 and drain diffusion layers 14 of the memory cell portion 11 and source contact portion 12 having a concentration of about $1\times11^{20}$ to $1\times10^{21}/cm^3$ are formed in a self-aligned manner with respect to the control gate 18 and isolation oxide film 32 of the drain area.

Subsequently, as shown in FIG. 6G, the memory cell portion 11 and source contact portion 12 are covered with a photo-resist, a pattern of photo-resist 36d is formed on the peripheral transistor portion 13, and the second layer of polysilicon 38 is etched to form the peripheral gate 22.

Subsequently, a photo-resist (not shown) ill which a predetermined portion of the peripheral transistor portion 13 is opened is formed, and a lightly doped drain (LDD) diffusion layer 39 having a concentration of about $1\times10^{18}$ to $1\times10^{20}/cm^3$ is formed in the self-aligned manner to the peripheral gate 22 and isolation oxide film 32 by the ion implantation method.

If necessary, the respective N-channel and P-channel transistors are subjected to this process. Phosphorus (P) or arsenic (As) is ion-implanted into the N-channel transistor, and boron (B) or boron fluoride ($BF_2$) is ion-implanted into the P-channel transistor.

Subsequently, as shown in FIG. 6H, the about 50 to 200 nm thick oxide film 27 is deposited on the entire surface of the memory cell portion 11, source contact portion 12 and peripheral transistor portion 13 by the LPCVD method.

Next, as shown in FIG. 6I, a photo-resist 36e is formed such that only the memory cell portion 11 is covered with the photo-resist, the oxide film 27 is etched back by anisotropic dry etching, and the side walls 30 are formed on the respective side surfaces of the control gate 18 and floating gate 17 of the source contact portion 12 and the peripheral gate 22 of the peripheral transistor portion 13.

Subsequently, after removing the photo-resist 36e, as shown in FIG. 6J, a photo-resist 36f is formed in such a manner that the predetermined portion of the peripheral transistor portion 13 is opened, impurities i are driven by the ion implantation method, and the peripheral diffusion layer 20 having a concentration of about $1\times10^{20}$ to $1\times10^{21}/cm^3$ is formed in the self-aligned manner with respect to the side wall 30 and isolation oxide film 32.

The respective N-channel and P-channel transistors are subjected to this process. Phosphorus (P) or arsenic (As) is ion-implanted into the N-channel transistor, and boron (B) or boron fluoride ($BF_2$) is ion-implanted into the P-channel transistor.

Next, after the photo-resist 36f is removed and a native oxide film is removed by wet oxide etching in a short time, a refractory metal such as titanium (Ti) or cobalt (Co) is deposited in a thickness of about 10 to 30 nm by a sputtering method or the like, and rapidly heated at about 600 to 700° C. for several tens of seconds.

Thereby, after the refractory metal is reacted with silicon and silicided, non-reacted refractory metal is removed, silicide is rapidly heated at about 750 to 850° C. for several tens of seconds, and resistance of silicide is lowered.

By his SALICIDE process, as shown in FIG. 6K, the respective upper surfaces of the control gate 18, drain diffusion layer 14 and source diffusion layer 16 of the source contact portion 12, and the respective upper surfaces of the peripheral gate 22 and peripheral diffusion layer 20 of the peripheral transistor portion 13, excluding the memory cell portion 11, are silicided in the self-aligned manner, and the suicide films 31 are formed on these respective upper surfaces.

Subsequently, as shown in FIG. 5, an undoped oxide film is deposited in a thickness of about 100 to 200 nm, a BPSG film is deposited in a thickness of about 500 to 1000 nm, these films are planezied by a chemo-mechanical polishing (CMP) method or the like, and the interlayer film 28 is formed.

After forming the interlayer film 28, the drain contact 15 of the memory cell portion 11, the source contact 19 of the source contact portion 12, and the peripheral contact 21 of the peripheral transistor portion 13 are opened by photo-etching, barrier metals such as titanium (Ti) and titanium nitride (TiN) are deposited, and tungsten (W) or the like is deposited and etched-back to fill the contacts. Thereafter, the bit line BL, source line SL and peripheral wiring 34 are formed by aluminum (Al) or the like, as shown in FIG. 5.

Therefore, a silicide blocking portion for preventing resistance dispersion from being caused by the insufficient silicidation of the source diffusion layer 16 is formed in a part of the surface of the source diffusion layer 16 in the memory cell portion 11.

As described above, in the first embodiment, the source area of the memory cell portion 11 is not silicided by a mask process. Therefore, the resistance dispersion caused by insufficient silicidation of the source area does not occur, and the resistance dispersion in the step portion by disconnection of the silicide film is not caused. The mask process can easily and simply be performed.

One embodiment of the semiconductor device of the present invention has been described above with reference to the drawings, but the invention is not limited to the present embodiment, and various modifications can be made within the scope of the present invention.
(Second Embodiment)

Figure 2:
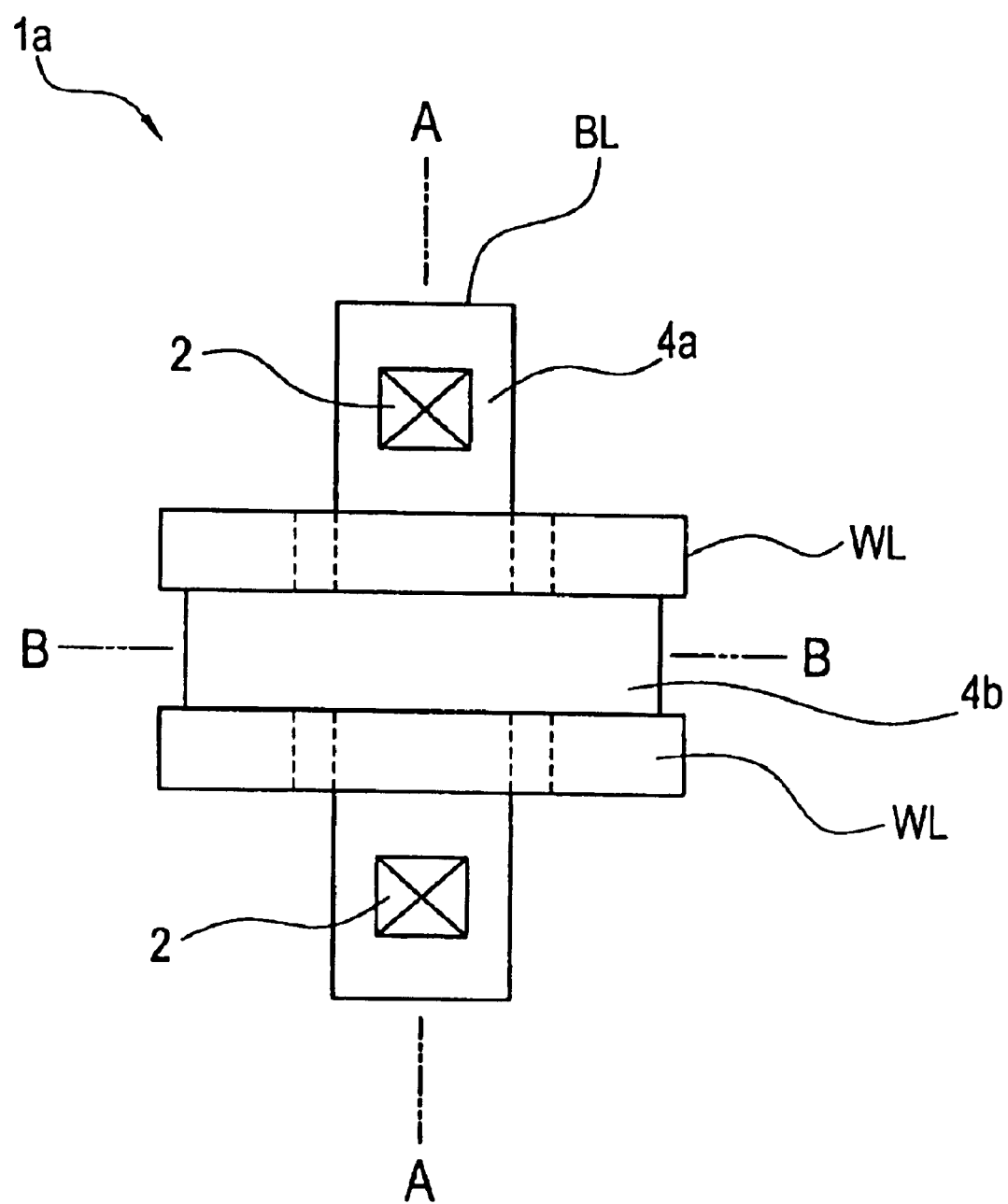
FIG. 2 is an explanatory plan view showing a part of a memory cell of FIG.
Figure 3A:
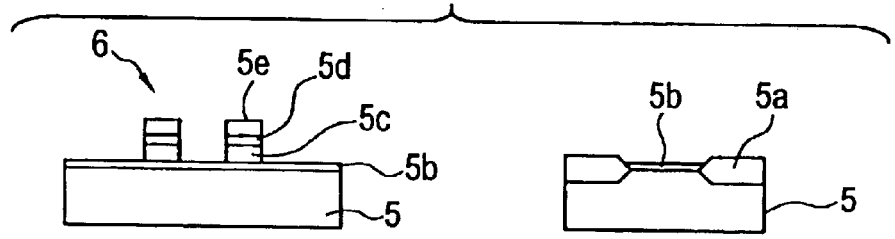
FIG. 3A shows sectional views taken along lines A—A and B—B of FIG. 2, showing a portion of a manufacturing process of a flash memory.
Figure 3B:
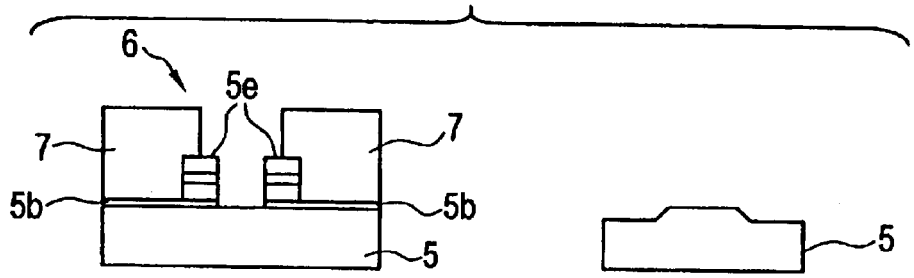
FIG. 3B shows sectional views taken along lines A—A and B—B of FIG. 2, showing a portion of a manufacturing process of a flash memory.
Figure 3C:
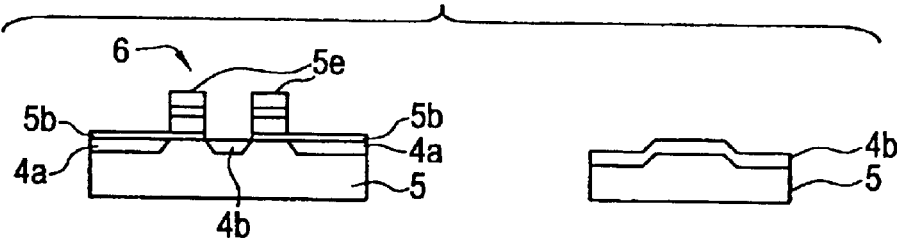
FIG. 3C shows sectional views taken along lines A—A and B—B of FIG. 2, showing a portion of a manufacturing process of a flash memory.
Figure 3D:
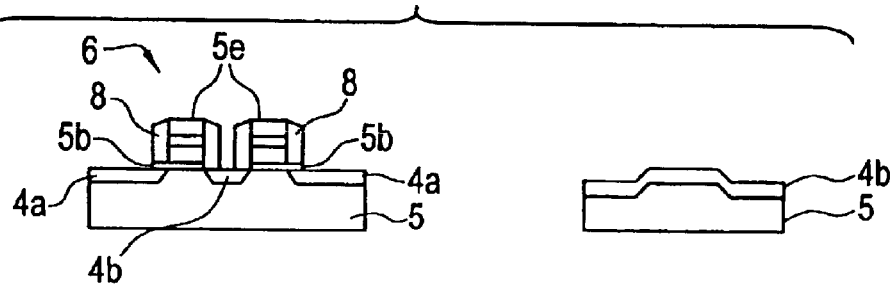
FIG. 3D shows sectional views taken along lines A—A and B—B of FIG. 2, showing a portion of a manufacturing process of a flash memory.
Figure 3E:
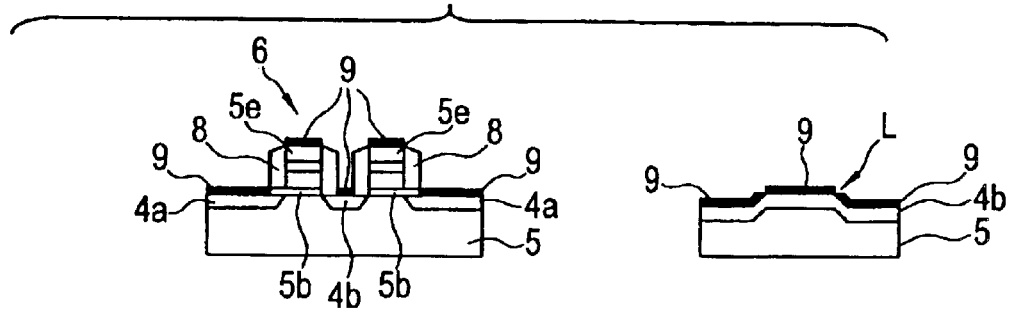
FIG. 3E shows sectional views taken along lines A—A and B—B of FIG. 2, showing a portion of a manufacturing process of a flash memory.
Figure 7:
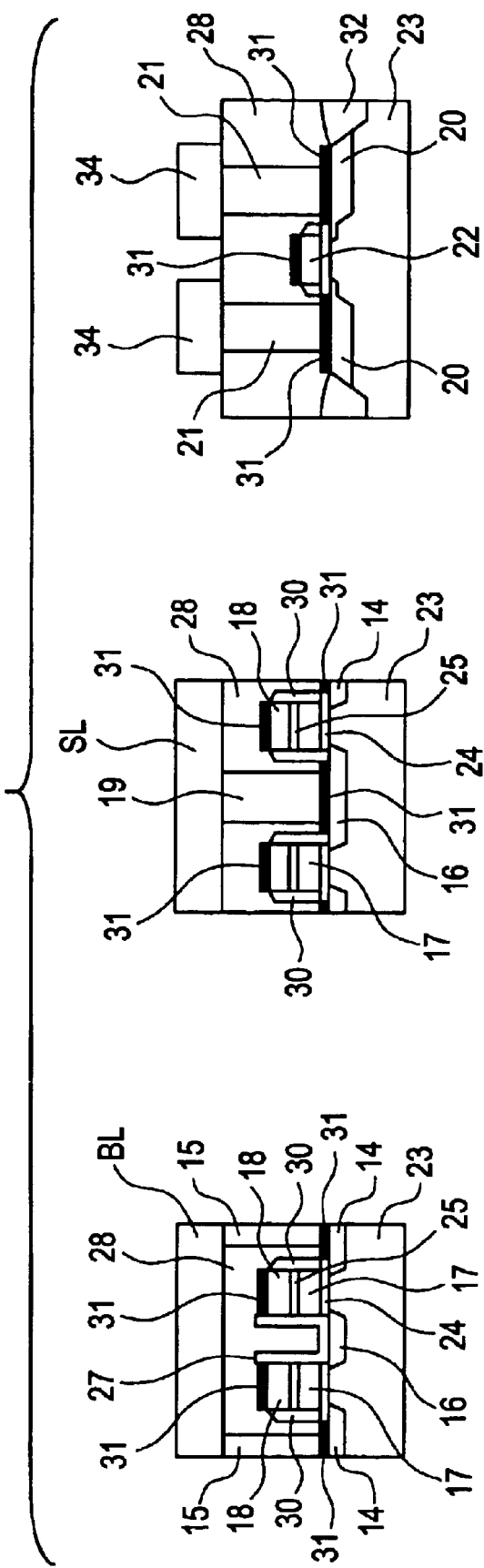
FIG. 7 is a sectional view taken along lines C—C, D—D and E—E of FIG. 4, showing structures of a memory cell portion, source contact portion and peripheral transistor portion of the semiconductor storage apparatus according to a second embodiment.

FIG. 7 is a sectional view similar to that of FIG. 2, showing the structure of the memory cell portion, source contact portion and peripheral transistor portion of the semiconductor storage apparatus according to a second embodiment.

As shown in FIG. 7, for the semiconductor storage apparatus of the second embodiment, the side walls 30 are formed on drain-side surfaces of the control gate 18, interpoly insulating film 25 and floating gate 17 of the memory cell portion 11. Additionally, the silicide films 31 are formed on the respective upper surfaces of the drain diffusion layer 14 and control gate 18. The other structure and formation are similar to those of the semiconductor storage apparatus 10 of the first embodiment as shown in FIG. 5.

FIGS. 8A to 8D are sectional views similar to those of FIGS. 6A to 6K, showing the manufacturing process of the semiconductor storage apparatus of FIG. 7. In the second embodiment, the process of FIGS. 6A to 6H in the first embodiment is similarly performed. Therefore, the subsequent process will be described hereinafter.

As shown in FIG. 8A, first a photo-resist 36g with which only the source diffusion layer 16 of the memory cell portion 11 is covered is formed.

Subsequently, as shown in FIG. 8B, the oxide film 27 is etched back by the anisotropic dry etching, and the side walls 30 are formed on the side surfaces on the drain side of the control gate 18, interpoly insulating film 25 and floating gate 17 of the memory cell portion 1, the side surfaces on both side of the control gate 18, interpoly insulating film 25 and floating gate 17 of the source contact portion 12, and the side surfaces on both sides of the peripheral gate 22 of the peripheral transistor portion 13.

Thereby, as shown in FIG. 5B, different from the first embodiment, the upper surfaces of the control gate 18 and drain diffusion layer 14 of the memory cell portion 11 are exposed.

Subsequently, as shown in FIG. 8C, similar to the first embodiment, the photo-resist 36f is formed in such a manner that the predetermined portion of the peripheral transistor portion 13 is opened, the impurities i are driven by the ion implantation method, and the peripheral diffusion layer 20 having a concentration of about $1 \times 10^{20}$ to $1 \times 10^{21}/cm^3$ is formed in the self-aligned manner with respect to the side wall 30 and isolation oxide film 32.

The respective N-channel and P-channel transistors are subjected to this process. Phosphorus (P) or arsenic (As) is ion-implanted into the N-channel transistor, and boron (B) or boron fluoride ($BF_2$) is ion-implanted into the P-channel transistor.

Next, as shown in FIG. 8D, similar to the first embodiment, by the SALICIDE process, excluding the source diffusion layer 16 of the memory cell portion 11, the respective upper surfaces of the control gate 18 and drain diffusion layer 14 of the memory cell portion 11, those of the control gate 18, drain diffusion layer 14 and source diffusion layer 16 of the source contact portion 12, and those of the peripheral gate 22 and peripheral diffusion layer 20 of the peripheral transistor portion 13 are silicided in the self-aligned manner, and the silicide films 31 are formed on these respective upper surfaces.

Next, similar to the first embodiment, after forming the interlayer film 28, the drain contact 15 of the memory cell portion 11, the source contact 19 of the source contact portion 12, and the peripheral contact 21 of the peripheral transistor portion 13 are opened, the barrier metals such as titanium (Ti) and titanium nitride (TiN) are deposited, and tungsten (W) or the like is deposited and etched-back to fill the contacts. Thereafter, the bit line BL, source line SL and peripheral wiring 34 are formed by aluminum (Al) or the like, as shown in FIG. 7.

As described above, in the second embodiment, in addition to the effect obtained in the first embodiment, the upper surface of the gate of the memory cell portion 11 can be silicided. Thereby, gate resistance is reduced, drain resistance is therefore reduced, and access speed can be raised.
(Third Embodiment)

Figure 9:
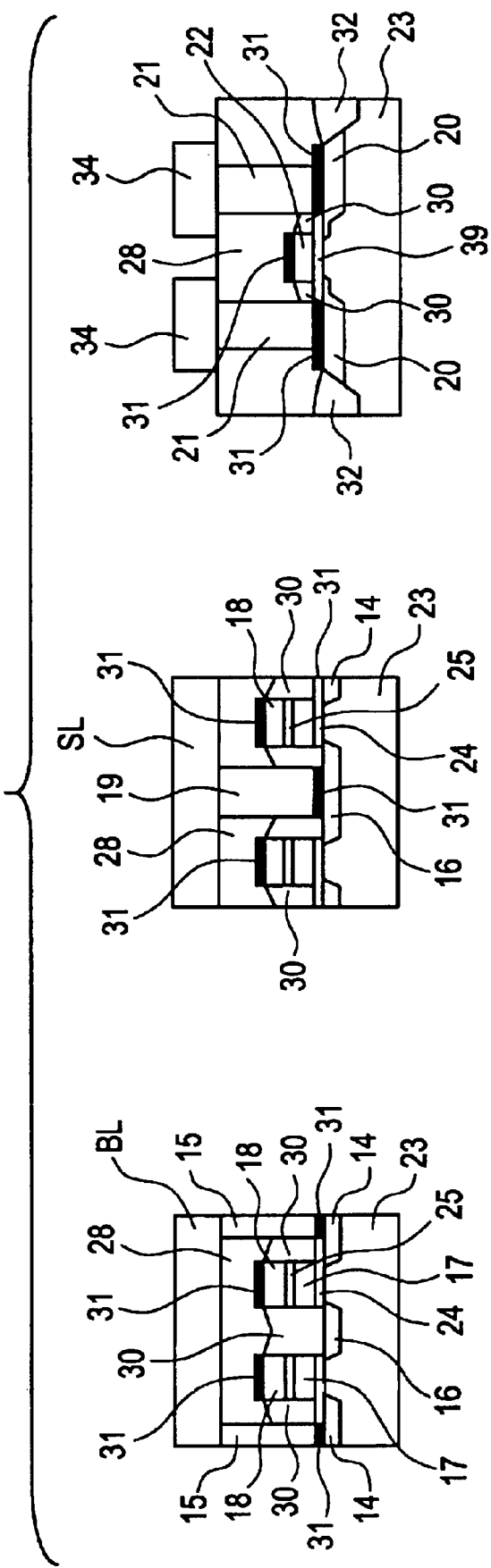
FIG. 9 is a sectional view taken along lines C—C, D—D and E—E of FIG. 4, showing structures of a memory cell portion, source contact portion and peripheral transistor portion of the semiconductor storage apparatus according to a third embodiment.

FIG. 9 is a sectional view similar to that of FIG. 5, showing the structure of the memory cell portion, source contact portion and peripheral transistor portion of the semiconductor storage apparatus according to a third embodiment.

As shown in FIG. 9, for the semiconductor storage apparatus of the third embodiment, the side walls 30 are formed and filling the source area of the memory cell portion 1. The other structure and formation are similar to those of the semiconductor storage apparatus 10 of the second embodiment, as shown in FIG. 7.

FIGS. 10A to 10D are sectional views similar to those of FIGS. 6A to 6K, showing the manufacturing process of the semiconductor storage apparatus of FIG. 9. In the third embodiment, the process of FIGS. 6A to 6G in the first embodiment is similarly performed. Therefore, the subsequent process will be described hereinafter.

As shown in FIG. 10A, first about 50 to 300 nm thick oxide film 27 is deposited on the entire surface of the memory cell portion 11, source contact portion 12 and peripheral transistor portion 13 by the LPCVD method.

In this case, a width of the source area between the adjacent transistors 26, and the thickness of the oxide film 27 to be deposited are set in such a manner that the source area of the memory cell portion 11 is filled with the oxide film 27.

Subsequently, as shown in FIG. 10B, the entire surface of the oxide film 27 is etched back by the anisotropic dry etching, and the side walls 30 are formed on the respective side walls of the control gate 18 and floating gate 17 of the memory cell portion 11 on both sides, those of the control gate 18 and floating gate 17 of the source contact portion 12 on both sides, and those of the peripheral gate 22 of the peripheral transistor portion 13 on both sides. In this case, the side walls 30 are filling the source area of the memory cell portion 1.

Figure 10C:
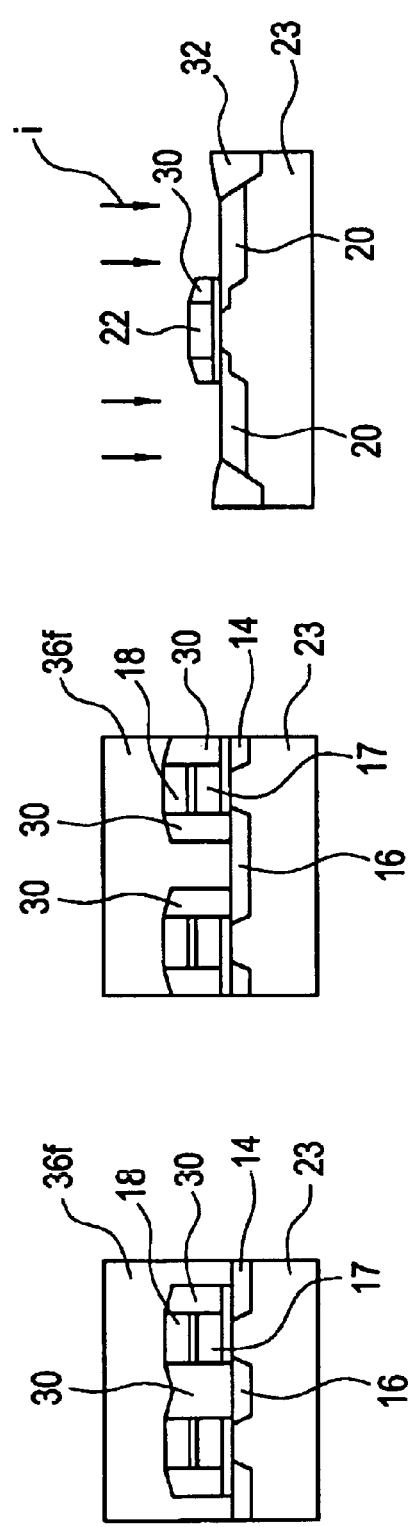
FIG. 10C shows sectional views taken along the lines C—C, D—D and B—B of FIG. 4, similar to those of FIGS. 6A to 6K, showing the manufacturing process of the semiconductor storage apparatus of FIG. 9.

Subsequently, as shown in FIG. 10C, similar to the first embodiment, the photo-resist 36f is formed in such a manner that the predetermined portion of the peripheral transistor portion 13 is opened, the impurities i are driven by the ion implantation method, and the peripheral diffusion layer 20 having a concentration of about $1\times10^{20}$ to $1\times10^2/cm^3$ is formed in the self-aligned manner with respect to the side wall 30 and isolation oxide film 32.

The respective N-channel and P-channel transistors are subjected to this process. Phosphorus (P) or arsenic (As) is ion-implanted into the N-channel transistor, and boron (B) or boron fluoride ($Bf_2$) is ion-implanted into the P-channel transistor.

Figure 10D:
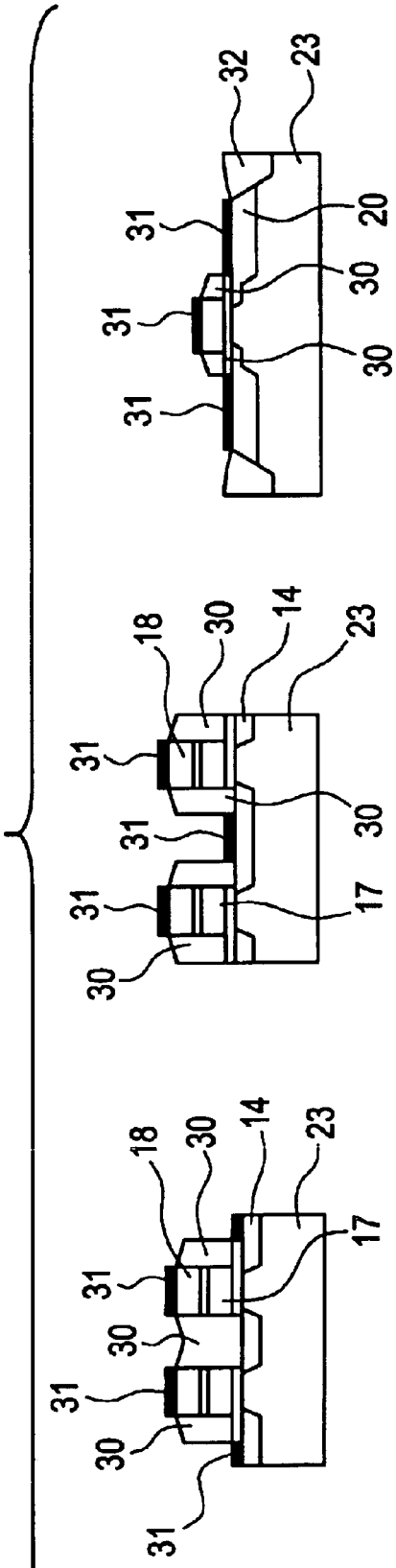
FIG. 10D shows sectional views taken along the lines C—C, D—D and E—E of FIG. 4, similar to those of FIGS. 6A to 6K, showing the manufacturing process of the semiconductor storage apparatus of FIG. 9.

Next, as shown in FIG. 10D, similar to the second embodiment, by the SALICIDE process, excluding the source diffusion layer 16 of the memory cell portion 11, the respective upper surfaces of the control gate 18 and drain diffusion layer 14 of the memory cell portion 11, those of the control gate 18, drain diffusion layer 14 and source diffusion layer 16 of the source contact portion 12, and those of the peripheral gate 22 and peripheral diffusion layer 20 of the peripheral transistor portion 13 are silicided in the self-aligned manner, and the silicide films 31 are formed on these respective upper surfaces.

Next, as shown in FIG. 9, similar to the first embodiment, after forming the interlayer film 28, the drain contact 15 of the memory cell portion 11, the source contact 19 of the source contact portion 12, and the peripheral contact 21 of the peripheral transistor portion 13 are opened, the barrier metals such as titanium (Ti) and titanium nitride (TiN) are deposited, and tungsten (W) or the like is deposited and etched back to fill the contacts. Thereafter, the bit line BL, source line SL and peripheral wiring 34 are formed by aluminum (Al) or the like.

As described above, in the third embodiment, in addition to the effect obtained in the second embodiment, no special mask for preventing the silicide film from being formed on the memory cell portion 11 is necessary. That is to say, the drain diffusion layer 14 and control gate 18 of the memory cell portion 11 are silicided in the self-aligned manner.

(Fourth Embodiment)

Figure 11:
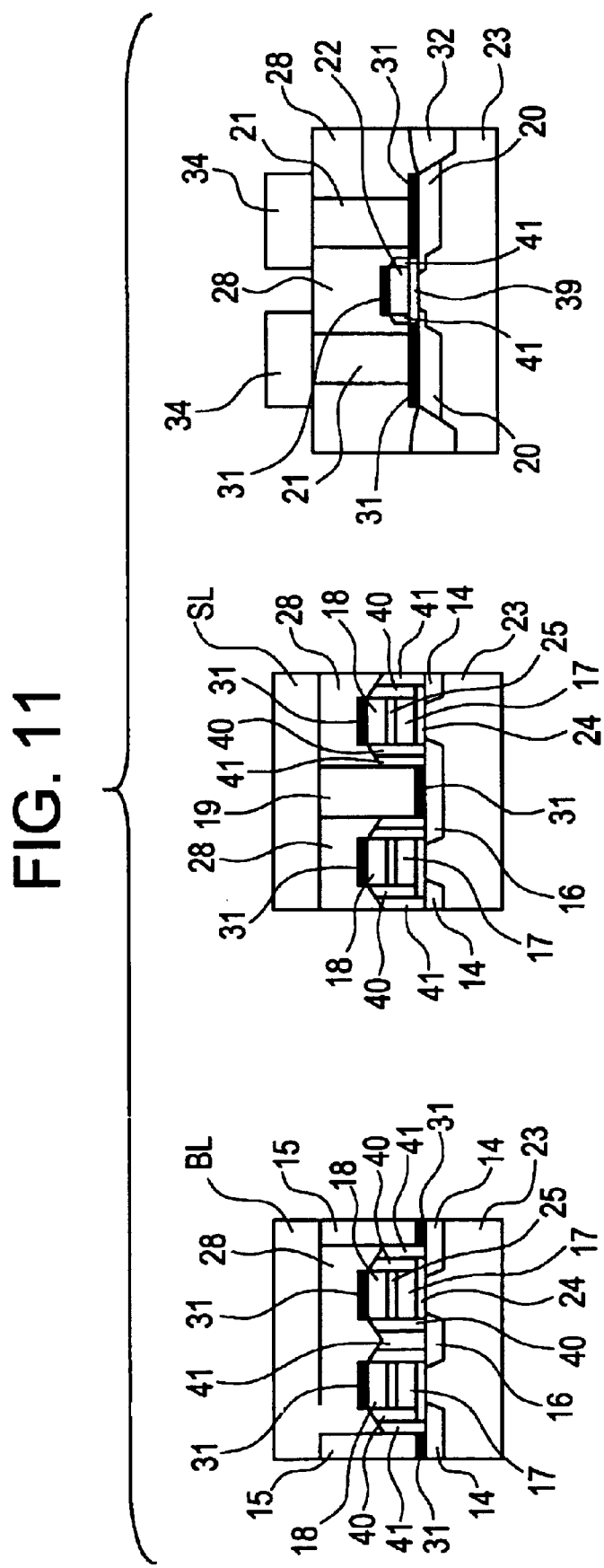
FIG. 11 is a sectional view taken along lines C—C, D—D and E—E of FIG. 4, showing structures of a memory cell portion, source contact portion and peripheral transistor portion of the semiconductor storage apparatus according to a fourth embodiment.

FIG. 11 is a sectional view similar to that of FIG. 5, showing the structure of the memory cell portion, source contact portion and peripheral transistor portion of the semiconductor storage apparatus according to a fourth embodiment.

As shown in FIG. 11, for the semiconductor storage apparatus of the fourth embodiment, a process for forming the side walls is performed twice in order to fill the source area of the memory cell portion 11 by the side walls. That is to say, first side walls 40 are formed on the memory cell portion 11 and source contact portion 12, respectively. Subsequently, second side walls 41 are formed on the respective side surfaces of the first side walls 40, and the peripheral gate 22 of the peripheral transistor portion 13. The other structure and formation are similar to those of the semiconductor storage apparatus 10, as shown in FIG. 5 of the third embodiment.

FIGS. 12A to 12G are sectional views similar to those of FIGS. 6A to 6K, showing the manufacturing process of the semiconductor storage apparatus of FIG. 11. In the fourth embodiment, the process of FIGS. 6A to 6F in the first embodiment is similarly performed. Therefore, the subsequent process will be described hereinafter.

As shown in FIG. 12A, first, a first oxide film 42 is deposited in a thickness of about 50 to 200 nm on the entire surface of the memory cell portion 11, source contact portion 12 and peripheral transistor portion 13 by the LPCVD method.

Subsequently, as shown in FIG. 12B, the entire surface of the first oxide film 42 is etched back by the anisotropic dry etching, and the first side walls 40 are formed on both sides of the control gate 18 and floating gate 17 of the memory cell portion 11, and both sides of the control gate 18 and floating gate 17 of the source contact portion 12.

Subsequently, as shown in FIG. 12C, similar to the first embodiment, the memory cell portion 11 and source contact portion 12 are covered with the photo-resist, the pattern of photo-resist 36d is formed on the peripheral transistor portion 13, and the second layer of polysilicon 38 is etched to form the peripheral gate 22.

Next, as shown in FIG. 12D, a second oxide film 43 is deposited in a thickness of about 50 to 200 nm on the entire surface of the memory cell portion 11, source contact portion 12 and peripheral transistor portion 13 by the LPCVD method. In this case, the width of the source area between the adjacent transistors 26, and the thickness of the second oxide film 43 to be deposited are set in such a manner that the source area of the memory cell portion 11 is filled with the second oxide film 43.

Figure 12E:
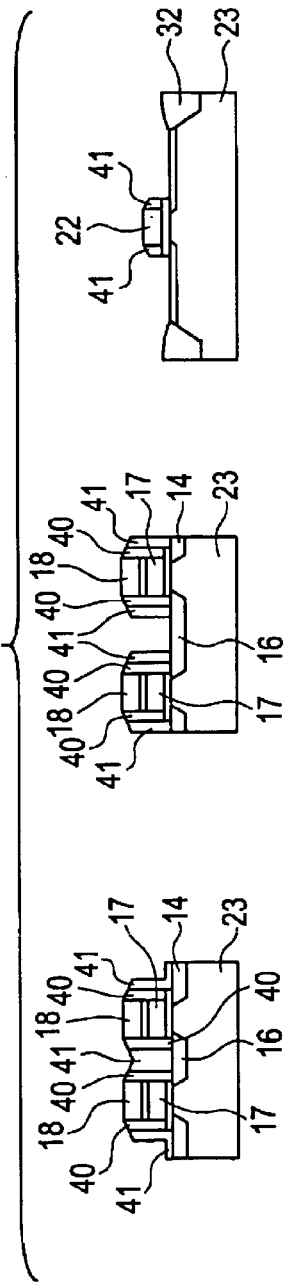
FIG. 12E shows sectional views taken along the lines C—C, D—D and E—E of FIG. 4, similar to those of FIGS. 6A to 6K, showing the manufacturing process of the semiconductor storage apparatus of FIG. 11.

Subsequently, as shown in FIG. 12E, the second oxide film 43 is etched back by the anisotropic dry etching, and the second side walls 41 are formed on the respective side surfaces of the first side walls 40 of the memory cell portion 11, the first side walls 40 of the source contact portion 12 and the peripheral gate 22 of the peripheral transistor portion 13.

That is to say, the first side wall 40 is combined with the second side wall 41, and fills the source area of the memory cell portion 11, and the thickness of the first oxide film 42 is set in accordance with this purpose.

Figure 12F:
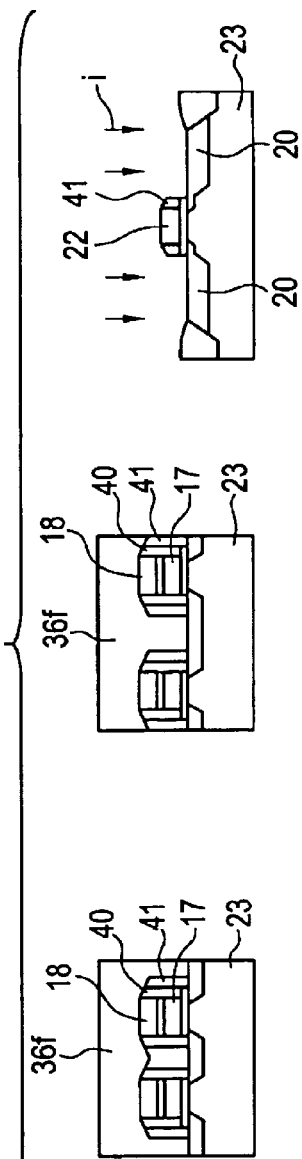
FIG. 12F shows sectional views taken along the lines C—C, D—D and E—E of FIG. 4, similar to those of FIGS. 6A to 6K, showing the manufacturing process of the semiconductor storage apparatus of FIG. 11.

Subsequently, as shown in FIG. 12F, similar to the first embodiment, the photo-resist 36f is formed in such a manner that the predetermined portion of the peripheral transistor portion 13 is opened, impurities i are driven by the ion implantation method, and the peripheral diffusion layer 20 having a concentration of about $1\times10^{20}$ to $1\times10^{21}/cm^3$ is formed in the self-aligned manner with respect to the second side wall 41 and isolation oxide film 32.

The respective N-channel and P-channel transistors are subjected to this process. Phosphorus (P) or arsenic (As) is ion-implanted into the N-channel transistor, and boron (B) or boron fluoride ($BF_2$) is ion-implanted into the P-channel transistor.

Figure 12G:
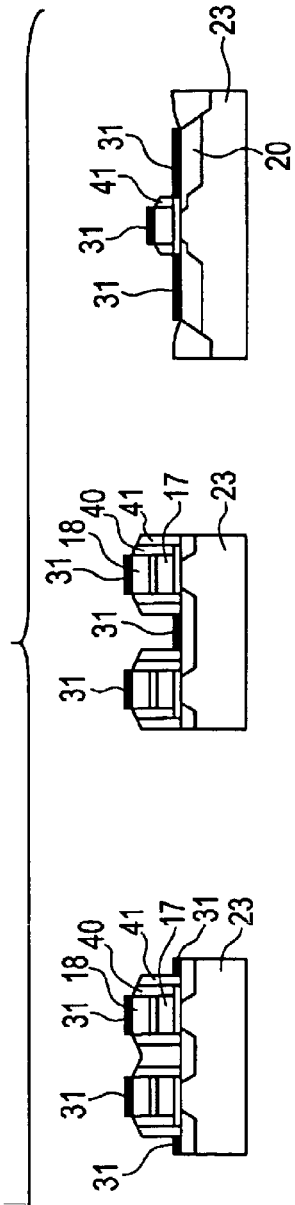
FIG. 12G shows sectional views taken along the lines C—C, D—D and E—E of FIG. 4, similar to those of FIGS. 6A to 6K, showing the manufacturing process of the semiconductor storage apparatus of FIG. 11.

Next, as shown in FIG. 12G, similar to the second embodiment, by the SALICIDE process, excluding the source diffusion layer 16 of the memory cell portion 11, the respective upper surfaces of the control gate 18 and drain diffusion layer 14 of the memory cell portion 11, those of the control gate 18, drain diffusion layer 14 and source diffusion layer 16 of the source contact portion 12, and those of the peripheral gate 22 and peripheral diffusion layer 20 of the peripheral transistor portion 13 are silicided in the self-aligned manner, and the silicide films 31 are formed on these respective upper surfaces.

Next, similar to the first embodiment, after forming the interlayer film 28, the drain contact 15 of the memory cell portion 11, the source contact 19 of the source contact portion 12, and the peripheral contact 21 of the peripheral transistor portion 13 are opened, the barrier metals such as titanium (Ti) and titanium nitride (TiN) are deposited, and tungsten (W) or the like is deposited and etched-back to fill the contacts. Thereafter, the bit line BL, source line SL and peripheral wiring 34 are formed by aluminum (Al) or the like, as shown in FIG. 11.

As described above, in the fourth embodiment, in addition to the effect obtained in the third embodiment, an effect is obtained that a degree of freedom of design increases.

That is to say, separately from the second side wall 41 of the peripheral transistor portion 13, the first side wall 40 is formed beforehand in the memory cell portion 11, and the first and second side walls 40, 41 are combined with each other and fill the source area. Therefore, the width of the source area is not determined by the width of the second side wall 41 which is determined from peripheral transistor properties.

Additionally, the second side wall 41 as the second layer of the transistor of the memory cell portion 11 is formed simultaneously with the second side wall 41 as the first layer of the transistor of the peripheral transistor portion 13. In this case, the side wall also fills the exposed portion of the source area. Therefore, a narrow portion is not silicided, and resistance does not become unstable.

As described above, according to the present invention, in the SALICIDE process of logic LSIs on which flash memories are embedded, the source diffusion layer of the memory cell portion 11 is not silicided. Therefore, there occurs neither a problem that resistance dispersion is caused by insufficient silicidation of the source area of the memory cell, nor a problem that resistance dispersion is caused by disconnection of the silicide film formed in a step portion generated during etching of the isolation oxide film and tunnel oxide film in the self-aligned source structure.

Additionally, various treatment methods, forming methods, and the like described in the aforementioned embodiments are only examples, the present invention is not limited to these, and other methods can be used to obtain similar action and effect within the scope of the invention.

As described above, according to the present invention, in the semiconductor storage apparatus having the memory cell portion in which the source area is formed by the self-aligned process, the silicide blocking portion is disposed in a part of the surface of the source area, so that resistance dispersion caused by the insufficient silicidation of the source area does not occur. Moreover, the self-aligned source area of the memory cell is not silicided. Therefore, the resistance dispersion caused by the disconnected silicide film in the step portion is Dot generated, and a small memory cell can be realized.

Moreover, according to a manufacturing method of a semiconductor storage apparatus of the present invention, the aforementioned semiconductor storage apparatus can be manufactured.

It is apparent that the present invention is not limited to the above embodiments, but may be modified and changed without departing from the scope and spirit of the invention.

What is claimed is:

1. A method of manufacturing a semiconductor device, comprising:
   selectively forming in a semiconductor substrate first, second, third, fourth, fifth and sixth diffusion regions apart from one another, said first and second diffusion regions constituting a first memory cell having a first floating gate over a first channel region sandwiched between said first and second diffusion regions and a first control gate over said first floating gate, said second and third diffusion regions constituting a second memory cell having a second floating gate over a second channel region sandwiched between said second and third diffusion regions and a second control gate over said second floating gate, said fourth and fifth diffusion regions constituting a third memory cell having a third floating gate over a third channel region sandwiched between said fourth and fifth diffusion regions and a third control gate over said third floating gate, said fifth and sixth diffusion regions constituting a fourth memory cell having a fourth floating gate over a fourth channel region sandwiched between said fifth and sixth diffusion regions and a fourth control gate over said fourth floating gate;
   forming a mask layer to cover a surface of said second region with leaving top surfaces of said first, second, third and fourth control gates and surfaces of said first, third, fourth and sixth diffusion regions uncovered;
   forming a silicide layer on said top surface of said first, second, third and fourth control gates and said surfaces of said first, third, fifth and sixth diffusion regions, said surfaces of said second region being free from formation of said silicide region by existence of said mask layer.

2. The method as claimed in claim 1, further comprising: forming an interlayer film over said semiconductor substrate after forming said silicide layer;
   forming a source line wiring on said interlayer film and a source contact connecting said source line wiring with said silicide layer on said fifth diffusion region.

3. The method as claimed in claim 1, said first, second and third diffusion regions being formed in a memory cell portion, and said fourth, fifth and sixth diffusion regions being formed in source contact portion.

4. A method of manufacturing a semiconductor memory devise, comprising:
   selectively forming in a semiconductor substrate first, second third, fourth, fifth and sixth diffusion region apart from one another, said first and second diffusion regions constituting a first memory cell having a first floating gate over a first channel region sandwiched between said first and second diffusion regions and a first control gate over said first floating gate, said second and third diffusion regions constituting a second memory cell having a second floating gate over a second channel region sandwiched between said second and third diffusion regions and a second control gate over said second floating gate, said fourth and fifth diffusion regions constituting a third memory cell having a third floating gate over a third channel region sandwiched between said fourth and fifth diffusion regions and third control gate over said third floating gate, said fifth and sixth diffusion regions constituting a fourth memory cell having a fourth floating gate over a fourth channel region sandwiched between said fifth and sixth diffusion regions and a fourth control gate over said fourth floating gate;
   forming a sidewall to cover a sidewall of said first floating gate and said first control gate, a sidewall of said second floating gate and said second control gate, a sidewall of said third floating gate and third control gate and a sidewall of said fourth floating gate and fourth control gate with leaving top surface of said first, second, third and fourth control gates and a surface of said first, second, third, fourth, fifth and sixth diffusion layers uncovered;

forming an insulating layer to fill up a space sandwiched between said sidewall of said first floating gate and said first control gate and said sidewall of said second floating gate and said second control gate with leaving top surface of said first, second, third and fourth control gates said surface of said first, third, fourth, fifth and sixth diffusion regions uncovered; and forming a silicide layer on said top surface of said first, second, third and fourth control gates and a surface of said first, third, fourth, fifth and sixth diffusion layers, said surface of said second diffusion layer being free from formation said silicide region by existence of said insulating layer.

5. The method as claimed in claim 4, said first, second and third diffusion regions being formed in a memory cell portion, and said fourth, fifth and sixth diffusion regions being formed in source contact portion.

6. A method of manufacturing a semiconductor device comprising:

selectively forming in a semiconductor substrate first, second, third, fourth, fifth and sixth diffusion regions apart from one another, said first and second diffusion regions constituting a first memory cell having a first floating gate over a first channel region sandwiched between said first and second diffusion regions and a first control gate over said first floating gate, said second and third diffusion regions constituting a second memory cell having a second floating gate over a second channel region sandwiched between said second and third diffusion regions and a second control gate over said second floating gate, said fourth and fifth diffusion regions constituting a third memory cell having a third floating gate over a third channel region sandwiched between said fourth and fifth diffusion regions and a third control gate over said third floating gate, said fifth and sixth diffusion regions constituting a fourth memory cell having a fourth floating gate over a fourth channel region sandwiched between said fifth and sixth diffusion regions and a fourth control gate over said fourth floating gate;

forming a mask layer to cover a surface of said second region with leaving top surfaces of said first, second third and fourth control gates uncovered; and forming a silicide layer on said top surface of said first, second, third and fourth control gates and said surfaces of said second region being free from formation of said silicide region by existence of said mask layer.

7. The method as claimed in claim 6, wherein said forming a mask layer includes uncovering surfaces of said first and third diffusion regions, said forming a silicide layer includes forming a silicide layer on said surfaces of said first and third diffusion regions.

8. A method of manufacturing a semiconductor device comprising:

selectively forming in a semiconductor substrate first, second, third, fourth, fifth and sixth diffusion regions apart from one another, said first and second diffusion regions constituting a first memory cell having a first floating gate over a first channel region sandwiched between said first and second diffusion regions and a first control gate over said first floating gate, said second and third diffusion regions constituting a second memory cell having a second floating gate over a second channel region sandwiched between said second and third diffusion regions and a second control gate over said second floating gate, said fourth and fifth diffusion regions constituting a third memory cell having a third floating gate over a third channel region sandwiched between said fourth and fifth diffusion regions and a third control gate over said third floating gate, said fifth and sixth diffusion regions constituting a fourth memory cell having a fourth floating gate over a fourth channel region sandwiched between said fifth and sixth diffusion regions and a fourth control gate over said fourth floating gate;

forming a sidewall to cover a sidewall of said first floating gate and said first control gate, a sidewall of said second floating gate and said second control gate, a sidewall of said third floating gate and third control gate and a sidewall of said fourth floating gate and fourth control gate with leaving top surface of said first, second, third and fourth control gates and a surface of said first, second, third, fourth, fifth and sixth diffusion layers uncovered;

forming an insulating layer to fill up a space sandwiched between said sidewall of said first floating gate and said first control gate and said sidewall of said second floating gate and said second control gate with leaving top surface of said first, second, third and fourth control gates said surface of said surface of said first and third diffusion regions uncovered; and forming a silicide layer on said top surface of said first, second third and fourth control gate and a surface of said first and third diffusion regions, said surface of said second diffusion region free from formation of said silicide by existence of said insulating layer.

9. The method as claimed in claim 8, wherein said forming an insulating layer includes uncovering said fifth diffusion region.

10. The method as claimed in claim 9, wherein said forming an insulating layer includes uncovering said fourth and sixth diffusion regions.

11. The method as claimed in claim 9, wherein said forming a silicide layer includes forming a silicide layer on said fifth diffusion regions.

12. The method as claimed in claim 8, wherein said forming a silicide layer includes forming a silicide layer on said fifth diffusion regions.

13. The method as claimed in claim 12, wherein said forming a silicide layer includes forming a silicide layer on said fourth and sixth diffusion regions.

* * * * *

UNITED STATES PATENT AND TRADEMARK OFFICE
CERTIFICATE OF CORRECTION

PATENT NO. : 6,849,490 B2
DATED : February 1, 2005
INVENTOR(S) : Fumihiko Hayashi It is certified that error appears in the above-identified patent and that said Letters Patent is hereby corrected as shown below:

Column 3,
Line 6, after "FIG." insert -- 1 --.

Column 4,
Line 35, delete "B-B" and insert -- E-E --.

Column 5,
Line 40, delete "Via" and insert -- via --.

Column 6,
Line 34, delete "suicide" and insert -- silicide --.
Line 53, delete "arc" and insert -- are --.

Column 8,
Line 5, delete "1x11$^{20}$" and insert -- 1x10$^{20}$ --.
Line 14, delete "ill" and insert -- in --.
Line 60, delete "his" and insert -- this --.

Column 10,
Line 49, delete "1." and insert -- 11. --.

Column 11,
Line 8, delete "1." and insert -- 11. --.
Line 20, delete "(Bf$_2$)" and insert -- (BF$_2$) --.

Signed and Sealed this

Twenty-seventh Day of December, 2005

JON W. DUDAS
*Director of the United States Patent and Trademark Office*